(12) United States Patent
Nagata et al.

(10) Patent No.: US 6,172,410 B1
(45) Date of Patent: Jan. 9, 2001

(54) COLLECTIVE SUBSTRATE OF ACTIVE-MATRIX SUBSTRATES, MANUFACTURING METHOD THEREOF AND INSPECTING METHOD THEREOF

(75) Inventors: Hisashi Nagata, Nara; Mikio Katayama, Ikoma; Toshihiro Yamashita, Shiki-gun; Manabu Takahama, Nara, all of (JP)

(73) Assignee: Sharp Kabushiki Kaisha, Osaka (JP)

( * ) Notice: Under 35 U.S.C. 154(b), the term of this patent shall be extended for 0 days.

(21) Appl. No.: 09/348,659

(22) Filed: Jul. 6, 1999

(30) Foreign Application Priority Data

Jul. 14, 1998 (JP) .................................................. 10-199227

(51) Int. Cl.[7] .......................... H01L 23/544; H01L 27/01; H01L 27/12; H01L 31/0392
(52) U.S. Cl. .............................. 257/620; 257/59; 257/72; 257/350
(58) Field of Search ................................ 257/59, 72, 208, 257/350, 390, 620

(56) References Cited

U.S. PATENT DOCUMENTS 5,742,074 * 4/1998 Takizawa et al. ...................... 257/59
5,757,054 * 5/1998 Miyawaki et al. ................... 257/390

FOREIGN PATENT DOCUMENTS

| 2-222925 | 9/1990 | (JP) . |
| 3-142499 | 6/1991 | (JP) . |
| 240800/1993 | 9/1993 | (JP) . |
| 7-005481 | 1/1995 | (JP) . |
| 7-333275 | 12/1995 | (JP) . |

* cited by examiner

Primary Examiner—Ngân V. Ngô
(74) Attorney, Agent, or Firm—Nixon & Vanderhye, PC

(57) ABSTRACT

A collective substrate of active-matrix substrates is divided into a first block and a second block. In cells of the first block and the second block, from a corresponding signal input pad group, an inspection scanning signal is inputted via a scanning-line short ring connecting line to scanning lines, an inspection display signal is inputted via a signal-line short ring connecting line to signal lines, and an auxiliary capacity wire signal is inputted via an auxiliary capacity wire main wire connecting line to auxiliary capacity wires. This arrangement makes it possible to perform an electrical inspection with high accuracy and efficiency on a large-format active-matrix substrate, and to manufacture an inspection probe frame in a simple manner at low cost.

13 Claims, 18 Drawing Sheets

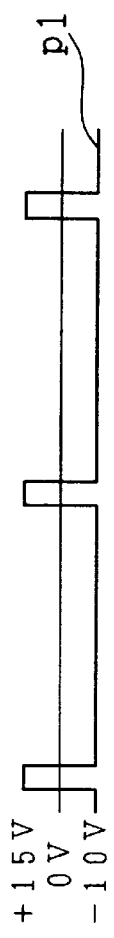
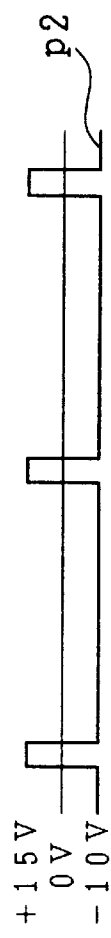
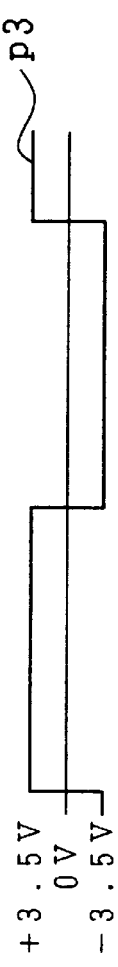
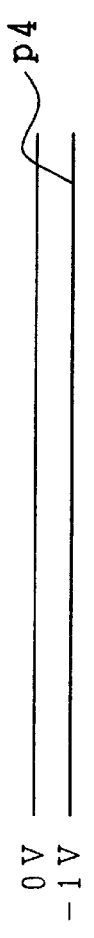
FIG. 14 (a) INSPECTION SCANNING SIGNAL
FIG. 14 (b) INSPECTION SCANNING SIGNAL
FIG. 14 (c) INSPECTION DISPLAY SIGNAL
FIG. 14 (d) AUXILIARY CAPACITY WIRE SIGNAL

US 6,172,410 B1

COLLECTIVE SUBSTRATE OF ACTIVE-MATRIX SUBSTRATES, MANUFACTURING METHOD THEREOF AND INSPECTING METHOD THEREOF

FIELD OF THE INVENTION

This invention relates to a collective substrate of active-matrix substrates that is used for an active-matrix liquid crystal display panel, in which a driving signal is applied via a switching element to a pixel electrode and a potential difference between electrodes opposing each other enables to provide a display.

BACKGROUND OF THE INVENTION

Conventionally, a liquid crystal display device has been provided with a plurality of pixel electrodes which are disposed in a matrix form, and opposing electrodes which oppose the pixel electrodes and serve as common electrodes. Liquid crystal serving as a display medium exists between the pixel and opposing electrodes. When a display is provided, a potential is selectively written by the pixel electrodes, and a voltage difference between the pixel electrodes and the opposing electrodes allows the liquid crystal existing therebetween to be subjected to an optical modulation, so that a display pattern is visually observed.

An active-matrix driving method has been known as a method for driving the pixel electrodes disposed in a matrix form. Each of the pixel electrodes is connected with a switching element and is driven by the switching element. A TFT (thin-film transistor) and an MIM (metal-insulating film-metal) elements are generally used as the switching element.

An active-matrix liquid crystal display device includes an active-matrix liquid crystal display panel, in which: (a) an active-matrix substrate having a plurality of scanning lines and a plurality of signal lines disposed so as to intersect one another on a transparent insulating substrate, each of the intersections having a pixel electrode and a switching element for driving the pixel electrode, and (b) an opposing substrate having opposing electrodes formed on a transparent insulating substrate, are provided with alignment films on the respective opposing surfaces and are bonded to each other via a liquid crystal layer.

FIG. 15 shows a construction of one pixel of the active-matrix substrate, which uses the TFT element (hereinafter, abbreviated as TFT) as the switching element.

A scanning line 2 is connected with a gate electrode of a pixel TFT 101, and a scanning signal inputted therein drives the pixel TFT 101. A signal line 3 is connected with a source electrode of the pixel TFT 101 and a display signal (video signal) is inputted therein. A drain electrode of the pixel TFT 101 is connected with a pixel electrode 104 and one of the terminals of an auxiliary capacity via an auxiliary capacity electrode 108. The other terminal of the auxiliary capacity is connected with an auxiliary capacity wire 4. Upon constructing a liquid crystal cell, the other terminal is connected to the opposing electrode disposed on the opposing substrate. On the insulating substrate, the pixel TFTs 101 and the pixel electrodes 104 are disposed in a matrix form.

FIG. 16 shows an example of the cross section of the active-matrix substrate. On an insulating substrate 117, a gate electrode 118, a gate insulating film 119, a semiconductor layer 120, an n$^+$-Si layer 121 serving as source and drain electrodes, a metal layer serving as a signal line 3, a between-layer insulating film 123, and a transparent conductor layer serving as a pixel electrode 104 are successively formed. The pixel electrode 104 is connected with the drain electrode of the pixel TFT 101 via a contact hole 125 penetrating the between-layer insulating film 123, specifically, via the auxiliary capacity electrode 108.

In the construction of FIG. 16, the between-layer insulating film 123 is formed between the scanning line 2 (disposed on the same layer as the gate electrode 118) and signal line 3 and the pixel electrode 104; thus, it is possible to allow the pixel electrode 104 to overlap the signal line 3. Such a construction makes it possible to improve an aperture rate and to shield an electric field caused by the signal line 3; consequently, alignment defects are prevented in liquid crystal.

Next, referring to FIG. 17, a succeeding process is described. FIG. 17 is a plan model view of the conventional active-matrix liquid crystal display device. Here, FIG. 17 illustrates a state in which one cell is cut out so as to correspond to each of the display devices of a large substrate. Actually, in many cases, a collective substrate is manufactured so as to include several cells formed laterally and longitudinally.

A polyimide alignment film is formed on an effective display area (inside a phantom line) 167 of a completed active-matrix substrate 150, and an aligning function is added by using an operation such as a rubbing operation. on an opposing substrate 151 as well, transparent opposing electrodes (not shown) including ITO (indium tin oxide) are formed, and then, a part corresponding to the effective display area 167 is subjected to the same operation.

Around the liquid crystal display panel, except for an inlet for filling liquid crystal (not shown), a sealing material (not shown) is applied thereon by using a printing method so as to surround the panel. Further, a conductive material 159 is applied to an opposing substrate signal input terminal 157 disposed on the active-matrix substrate 150, and then, spacers (not shown) are dispersed for maintaining a cell thickness of the liquid crystal layer, the active-matrix substrate 150 is bonded to the opposing substrate, and a heating operation is performed so as to harden the sealing material.

Afterwards, the cells, which are formed laterally and longitudinally in the collective substrate of the active-matrix substrate 150, are cut out one by one, liquid crystal is filled from the liquid crystal inlet, and the liquid crystal inlet is filled with the sealing material so as to achieve the panel of the liquid crystal display device. And then, a source driver 160a for applying a display signal to each of the signal lines 3, a gate driver 160b for applying a scanning signal to each of the scanning lines 2, a control circuit (not shown), a back light (not shown), and other members are installed so as to complete the liquid crystal display device. Here, the liquid crystal display device of FIG. 17 is not provided with the auxiliary capacity wire 4.

Normally, on such a liquid crystal display device, an optical inspection is performed in each step of the process, an electrical inspection is performed when the active-matrix substrate is completed, and a lighting and an electrical inspections are performed between when the panel is completed and when members including a driver have been installed.

These inspections are carried out so as not to allow defected portions to remain in the succeeding process. The defected portions cause loss of materials and works. When a defect is found, the substrate is discarded immediately, or the defect is corrected by using a means such as a laser.

Incidentally, because of the recent improvement of manufacturing techniques, a liquid crystal display panel has offered a higher definition. Accordingly, the inspection also requires a more improved technique.

Namely, terminals for inputting signals to the signal lines 3 and the scanning lines 2 has a shorter pitch. When pins electrically become contact with the lines so as to supply signals, it is necessary to provide an extremely fine and expensive probe. Further, in some cases, even small dust on the terminal does not allow a normal lighting upon inspection; thus, an inspection defect may be mistakenly recognized as a defect of the panel. In order to solve this problem, the inspection needs to be performed in an extremely clean environment. Therefore, it is necessary to increase the total cost.

Hence, in order to realize a simpler lighting inspection performed upon completion of the panel, in the liquid crystal display device of FIG. 17, the signal lines 3 and scanning lines 2 for applying the same signals upon inspection are respectively short-circuited by inspection display signal lines 152a, 152b, and 152c, and inspection scanning signal lines 153a and 153b. Normally, after the inspection, these lines are cut of together with the substrate portion by dicing along cutting lines L1, or they are electrically cut off by using a means such as a laser cutting (for example, see Japanese Published Unexamined Patent Application no. 005481/1995 (Tokukaihei 7-005481, published on Jan. 10, 1995)).

However, this method causes the following problem: the number of the steps is increased by including the cutting operation. Further, another defect may occur due to a flake of the wiring pattern or a fragment of glass during the cutting operation. Moreover, in the case of the dicing operation, a large substrate needs to be provided with useless areas to be cut out, resulting in a decrease in the number of panels.

Therefore, in order to solve these problems, as shown in FIG. 18, inspection signal lines for applying the same inspection signal are not electrically continuous in a complete manner. Instead, active elements such as TFT are placed and a signal is applied upon inspecting if necessary so as to bring the active element into conduction; thus, it is possible to obtain the same effect as the arrangement having a short circuit. This method is disclosed in Japanese Published Unexamined Patent Application no. 333275/1995 (Tokukaihei 7-333275, published on Dec. 22, 1995). In the liquid crystal display device, the signal lines 3 and scanning lines 2 for applying the same signals upon inspection are respectively short-circuited by inspection display signal lines 172a and 172c, and inspection scanning signal line 173a. Further, inspection TFTs 174a and 174b are formed respectively for the signal lines 3 and the scanning lines 2, and switching wires 172b and 173b are formed for entering a signal which turns the TFTs on and off.

Incidentally, as described above, it is more cost-effective to find a defect appearing in the process as soon as possible and to correct the defect or to discard the substrate. Especially, after the active-matrix substrate is completed, the total cost of the product considerably varies depending upon whether an expensive color filter is bonded to or not, and whether an extremely expensive liquid crystal material is filled or not, before a defect has been found on the substrate. Therefore, more than the optical inspection, on the completed active-matrix substrate, it is critically important to carry out an electrical inspection, in which an inspection signal similar to an actual driving signal is written via the active element to the pixel, and the inspection signal is read therein.

Here, another method is known as an electrical inspection method, in which signals are successively applied via the active elements on a large-format substrate, each of the pixels is charged, and then, the signals are successively read via the active elements so as to electrically obtain information on a defect occurring on the screen (for example, see Japanese Published Unexamined Patent Application no. 142499/1991 (Tokukaihei 3-142499, published on Jun. 18, 1991)).

This method makes it possible to detect a defected active-matrix substrate before the opposing substrate has been bonded. However, when a point defect is detected by using this method, it is necessary to precisely read an extremely small electrical signal. Thus, in addition to difficult problems such as the arrangement of a reading amplifier, optimization of the circuit sequence, and a balance between the time constant and the reading time period of the pixel TFT, this method causes a large difference between the electrical inspection result and the display inspection result, especially upon detecting irregular display and a low-brightness point.

Furthermore, in another method, materials, whose refractive indexes vary in accordance with electric fields, are placed around the pixel electrodes, and the materials are successively scanned so as to detect a defect entirely on the substrate by reading a potential of each of the pixels through a behavior upon emitting light on these materials (for example, see Japanese Published Unexamined Patent Application no. 240800/1993 (Tokukaihei 5-240800, published on Sep. 17, 1993)).

This method makes it possible to eliminate influence of noise when a signal is read via the active element and the inspection wire, so that accuracy of the inspection can be improved. Furthermore, as described in the method of Tokukaihei 7-005481, in the case when the wires, which apply the same signals at a lighting inspection after the panel has been completed, are previously short-circuited by the inspection signal lines and the inspection scanning lines, the wires can be used upon an electrical inspection of the process.

However, as for all the above-mentioned methods, upon inspection on a large-format substrate, it is necessary to apply a plurality of kinds of signals to each of the cells. The smaller the cell is, or the more individual cells are disposed on a large format, it becomes more difficult to apply a signal to each of the cells.

In general, a probe frame is used as a means for applying a signal to a cell. In the probe frame, the frame board having the same size as the substrate is provided with windows corresponding to the cells, and signal input pins are set up so as to surround the windows. In the active-matrix substrate opposing the probe frame, a vacant area, which surrounds an effective display area of each of the cells, is provided with signal input pads.

However, unlike a large model, vacant areas are small in a small model, so that a restriction is imposed on providing the signal input pads for inspection. Especially, in the case when an inspection wire is provided for each of RGB upon performing an electrical inspection for a color display in order to enhance accuracy of the inspection, or in the case when a scanning line of the adjacent pixel is used as an auxiliary capacity wire in the same manner as a so-called Cs On Gate structure so as to input a number of signals for driving one cell, the signal input pad needs to be smaller in size. For this reason, this arrangement further causes a poor contact of the pins in the probe frame and increases the cost of manufacturing the probe frame in accordance with a higher density.

Furthermore, in the case of the extremely small windows of the probe frame, a detection element cannot freely move inside the window, a ratio of ineffective area surrounding the element becomes larger in the cell, and in addition, the detection element may become larger than the window in the worst case; consequently, the detection element cannot come close to the pixel electrode, so that the inspection may become impossible.

Additionally, the more individual cells are placed on a large-format substrate, the number of the pins considerably increases. The number of the pins is determined by the number of positions × the number of kinds of signals. Generally, the cost of manufacturing the probe frame is determined by man-hours for opening the windows, the number of the disposed pins, and the accuracy; thus, if the more cells are disposed, all the other factors increase accordingly, resulting in a significant raise in the cost.

SUMMARY OF THE INVENTION

The present invention is devised in order to solve the above-mentioned problems. The objective is to provide a collective substrate of active-matrix substrates that makes it possible to perform an electrical inspection on a large-format collective substrate of active-matrix substrates with a high efficiency and accuracy, and to readily manufacture an inspection probe frame at low cost, and to provide a manufacturing method thereof and an inspecting method thereof.

In order to achieve the above-mentioned objective, a collective substrate of active-matrix substrates of the present invention, a plurality of active-matrix substrates, each including: on an insulating substrate, a plurality of pixel electrodes; pixel switching elements, each being connected with each of the pixel electrodes; a plurality of scanning lines and signal lines which drive the pixel electrode via the pixel switching element and are disposed in a lattice form; a scanning-line common wire which is connected with the scanning lines; and a signal-line common wire which is connected with the signal lines, wherein the scanning-line common wires are electrically connected with each other and the signal-line common wires are electrically connected with each other so as to form said collective substrate.

Further, in order to achieve the above-mentioned objective, a method for manufacturing a collective substrate of active-matrix substrates of the present invention includes the steps of: forming a plurality of pixel electrodes, pixel switching elements, each being connected with the pixel electrode, and a plurality of scanning lines and signal lines which drive the pixel electrodes via the pixel switching elements and are disposed in a lattice form, in each of the active-matrix substrates; and forming a scanning-line common wire connected with the scanning lines and a signal-line common wire connected with the signal lines in one of a scanning-line layer and a signal-line layer, that is lower than the other layer, for each of the active-matrix substrates, by electrically connecting the scanning-line common wire to another and the signal-line common wire to another among a plurality of active-matrix substrates.

Furthermore, in order to achieve the above-mentioned objective, a method for inspecting a collective substrate of active-matrix substrates of the present invention, a plurality of the active-matrix substrates, each including: on an insulating substrate, a plurality of pixel electrodes; pixel switching elements, each being connected with each of the pixel electrodes; a plurality of scanning lines and signal lines which drive the pixel electrode via the pixel switching element and are disposed in a lattice form; a scanning-line common wire which is connected with the scanning lines; and a signal-line common wire which is connected with the signal lines, wherein the scanning-line common wires are electrically connected with each other and the signal-line common wires are electrically connected with each other so as to form said collective substrate, said method including a step of supplying an inspection scanning signal and an inspection display signal respectively to the scanning-line common wire and the signal-line common wire so as to detect a pixel voltage in each of the active-matrix substrates.

The above-mentioned construction, manufacturing method, and inspecting method make it possible to reduce the number of input pins of a probe frame used for an electrical inspection of the active-matrix substrate; therefore, it is possible to dramatically reduce the cost for manufacturing the probe frame.

Moreover, when a detecting section of the probe frame scans in an electrical inspection, it is possible to successively scan a plurality of active-matrix substrates with one operation so as to reduce the operation time of non-detection period including an ascending/descending operation of the detecting section. Therefore, the working efficiency of the electrical inspection can be remarkably improved. Further, it is possible to reduce a non-inspectable area caused by the exterior of the detecting section and the constraint on manufacturing the probe frame; consequently, the inspection performance can be improved.

Additionally, it is not necessary to provide a signal inputting pad for an electrical inspection in each of the active-matrix substrates; thus, it is possible regulate stripe-shaped unevenness of the alignment property, that is caused by the shape of the signal inputting sections, and it is possible to prevent a defect caused by static electricity from appearing upon completion of the product.

Furthermore, in order to achieve the aforementioned objective, the collective substrate of the active-matrix substrates of the present invention is provided with signal inputting sections for inputting an inspection scanning signal and an inspection display signal respectively to the scanning-line common wire and the signal-line common wire, in the circumferential parts of the collective substrate.

This arrangement makes it possible to input inspection signals of the electrical inspection from the signal inputting sections, which are disposed in the circumferential parts of the collective substrate, via the scanning-line common wires and the signal-line common wires to a plurality of active-matrix substrates at one time. Therefore, regardless of a final form of a liquid crystal display device, it is possible to freely dispose the signal inputting sections of an inspection signal.

Additionally, the signal inputting sections are located in the circumferential parts of the collective substrate, not in each of the active-matrix substrates, so that it is possible to regulate stripe-shaped unevenness of the alignment property, that is caused by the shape of the signal inputting sections.

For a fuller understanding of the nature and advantages of the invention, reference should be made to the ensuing detailed description taken in conjunction with the accompanying drawings.

BRIEF DESCRIPTION OF THE DRAWINGS

FIG. 14(a) is a timing chart of an inspection scanning signal that is applied to the collective substrates of the active-matrix substrates shown in FIGS. 1 through 5, and 7 through 12, upon an electrical inspection.

FIG. 14(b) is a timing chart of an inspection scanning signal that is applied to the collective substrates of the active-matrix substrates shown in FIGS. 1 through 5, and 7 through 12, upon an electrical inspection.

FIG. 14(c) is a timing chart of an inspection display signal that is applied to the collective substrates of the active-matrix substrates shown in FIGS. 1 through 5, and 7 through 12, upon an electrical inspection.

FIG. 14(d) is a timing chart of an auxiliary capacity wire signal that is applied to the collective substrates of the active-matrix substrates shown in FIGS. 1 through 5, and 7 through 12, upon an electrical inspection.

DESCRIPTION OF THE EMBODIMENTS

[EMBODIMENT 1]

Figure 1:
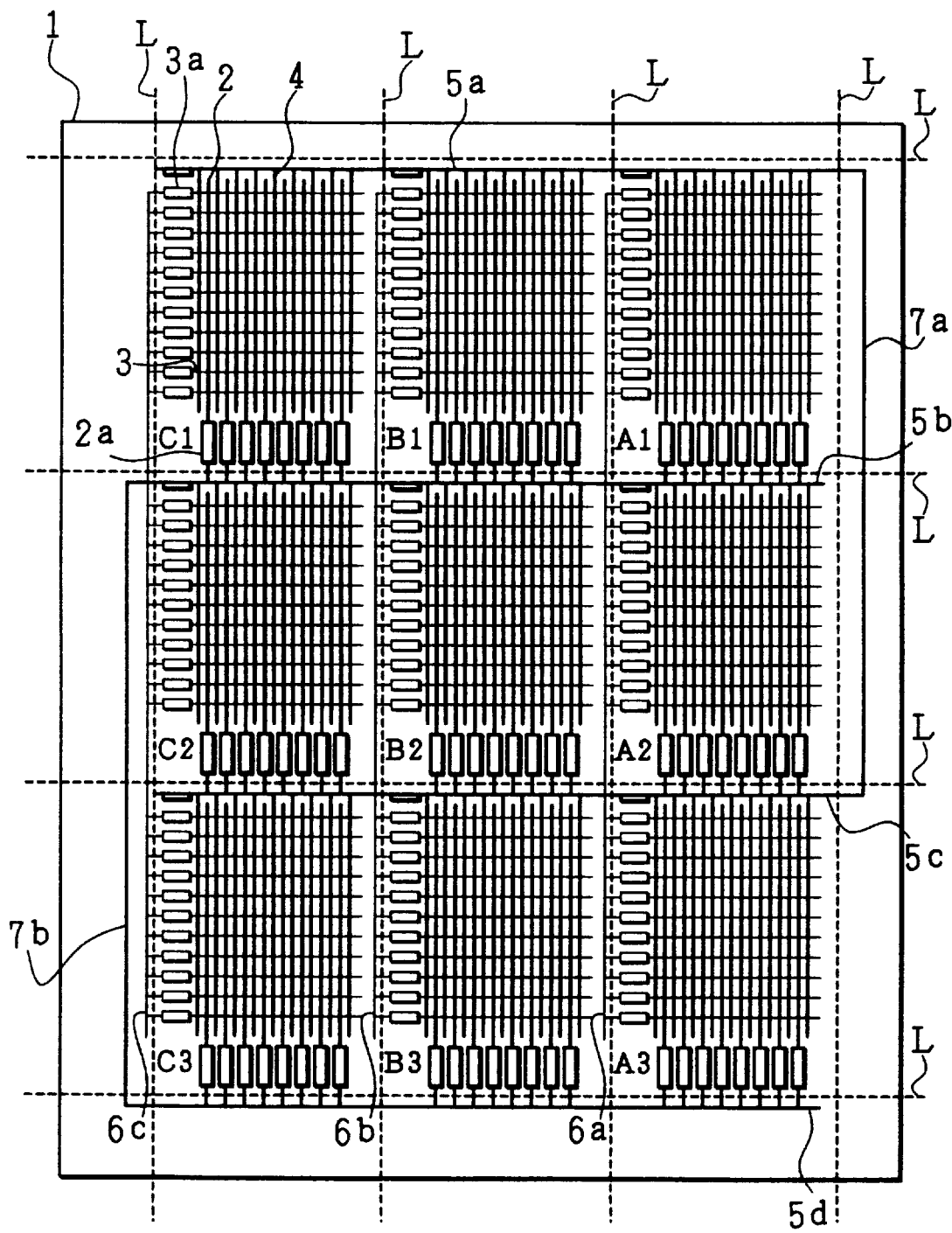
FIG. 1 is a plan model view schematically showing a collective substrate of active-matrix substrates in accordance with one embodiment of the present invention.

Referring to FIGS. 1 and 14(a) through 14(c), the following explanation describes one embodiment of the present invention. Here, for convenience of explanation, those members that are described in the conventional art are indicated by the same reference numerals and the description thereof is omitted.

In the following explanation on each embodiment of the present invention, the construction including pixels and the steps of the manufacturing process are the same as the conventional method, and the description thereof is omitted. Namely, an active-matrix substrate in each embodiment of the present invention is allowed to have the following constructions: (1) a construction in which pixel electrodes are disposed so as to overlap a bus line via a between-layer insulating film which is described in the conventional art, (2) a more conventional construction in which the pixel electrodes are disposed in an area surrounded by signal lines and scanning lines, and (3) a construction in which the scanning lines are disposed above the signal lines.

FIG. 1 is a plan model view schematically showing a collective substrate of the active-matrix substrates in accordance with the present embodiment. Here, in FIG. 1, wires formed in the scanning-line layer are shown by thick lines, and wires formed in the signal-line layer are shown by thin lines.

As shown in FIG. 1, a collective substrate 1 of the active-matrix substrates (hereinafter, abbreviated as a collective substrate) has a plurality of cells formed laterally and longitudinally on an insulating substrate. Here, as shown in FIG. 1, the following explanation discusses the collective substrate 1, in which nine cells (active-matrix substrate) of A1, A2, A3, B1, B2, B3, C1, C2, and C3 (each of the cells is surrounded by cutting lines L, which are indicated by broken lines and are described later) are arranged in three columns (from the right, A column, B column, and C column)×three rows (from above, first row, second row, and third row). The number and positions of the cells are allowed to vary from this arrangement.

Further, the collective substrate 1 is provided with a circumferential part for handling, in which no cell is formed, around the nine cells. Therefore, in a cutting operation of the manufacturing process, the collective substrate 1 is cut along the cutting lines L so as to cut out the active-matrix substrates one by one. Moreover, in each of the cells, scanning lines 2 and auxiliary capacity wires 4 (in FIG. 1, thick lines disposed longitudinally), and signal lines 3 (in FIG. 1, thin lines disposed laterally) are arranged in a lattice form.

The scanning lines 2 are connected with scanning-lines short rings (scanning-line common wire) 5a, 5b, 5c, and 5d. Additionally, the scanning-line short rings 5a through 5d also serve as main wires which bundle auxiliary capacity wires 4 of the adjacent cells.

Namely, the scanning-line short ring 5a, which is disposed so as to cross the upper ends of the cells A1, B1, and C1, is connected with the auxiliary capacity wires 4 of the cells A1, B1, and C1, in the upper ends of the cell A1, B1, and C1 of the first row. The scanning-line short ring 5b, which is disposed so as to cross the upper ends of the cells A2, B2, and C2, is connected with the auxiliary capacity wires 4 of the cells A2, B2, and C2, in the upper ends of the cells A2, B2, and C2 of the second row. The scanning lines 2 of the cells A1, B1, and C1 of the first row are extended downward over the cell boundary so as to be connected with the scanning-line short ring 5b via scanning-line terminals 2a. The scanning-line short ring 5c, which is disposed so as to cross the upper portions of the cells A3, B3, and C3, is connected with the auxiliary capacity wires 4 of the cells A3, B3, and C3, in the upper portions of the cells A3, B3, and C3 of the third row. The scanning lines 2 of the cells A2, B2, and C2 of the second row are extended downward over the cell boundary so as to be connected with the scanning-line short ring 5c via the scanning-line terminals 2a. In the circumferential part of the collective substrate 1, that is adjacent to the lower ends of the cells A3, B3, and C3, the scanning-line short ring 5d, which is disposed so as to cross the lower ends of the cells A3, B3, and C3, is connected with the scanning lines 2 of the cells A3, B3, and C3 of the third row. The scanning lines 2 are extended downward so as to be connected with the scanning-line short ring 5d via the scanning-line terminals 2a.

Further, the scanning-line short rings 5a and 5c are extended to the right ends of the cells A1 and A2 in the collective substrate 1. The scanning-line short rings 5a and 5c are electrically connected with each other via a scanning-line short ring connecting line 7a in the circumferential part. In the same manner, the scanning-line short rings 5b and 5d are extended to the left ends of the cells C2 and C3 in the collective substrate 1. The scanning-line short rings 5b and 5d are electrically connected with each other via a scanning-line short ring connecting line 7b in the circumferential part.

Namely, the scanning-line short rings 5a through 5d, which bundle the scanning lines 2 and the auxiliary capacity wires 4, form two main electrodes on the collective substrate 1. Specifically, one of the main electrodes is composed of the auxiliary capacity wires 4 of the cells A1, B1, C1, A3, B3, and C3, the scanning-line short rings 5a and 5c for connecting the scanning lines 2 of the cells A2, B2, and C2, and the scanning-line short ring connecting line 7a; and the other main electrode is composed of the auxiliary capacity wires 4 of the cells A2, B2, and C2, the scanning-line short rings 5b and 5d for connecting the scanning lines 2 of the cells A1, B1, C1, A3, B3, and C3, and the scanning-line short ring connecting line 7b.

Here, the cutting lines L are positioned between the scanning-line short rings 5b, 5c, and 5d and the scanning-line terminals 2a; thus, when the collective substrate 1 is cut along the cutting lines L, the scanning lines 2 are cut away from the scanning-line short rings 5b, 5c, and 5d, so that each of the scanning lines 2 becomes electrically independent. On the other hand, the scanning-line short rings 5a through 5d, which are divided for each of the cells, remain connected with the auxiliary capacity wires 4 in each of the cells and serve as main wires for bundling the auxiliary capacity wires 4 in each of the cells; thus, it is possible to apply DC level or signals used for all the lines in common, upon completion of the liquid crystal display device.

Meanwhile, the signal lines 3 are connected with signal-line short rings (signal-line common wire) 6a, 6b, and 6c. Namely, the signal-line short ring 6a, which is disposed so as to run through the right ends of the cells B1, B2, and B3, is connected with the signal lines 3 of the cells A1, A2, and A3 of A column, in the right ends of the cells B1, B2, and B3. The signal lines 3 are extended to the left over the cell boundary so as to be connected with the signal-line short ring 6a via signal line terminals 3a. The signal-line short ring 6b, which is disposed so as to run through the right ends of the cells C1, C2, and C3, is connected with the signal lines 3 of the cells B1, B2, and B3 of B column, in the right ends of the cells C1, C2, and C3 of C column. The signal lines 3 are extended to the left over the cell boundary so as to be connected with the signal-line short ring 6a via signal line terminals 3a. In a circumferential part of the collective substrate 1, that is adjacent to the left ends of the cells C1, C2, and C3, a signal-line short ring 6c, which is disposed so as to run through the left portions of the cell C1, C2, and C3, is connected with the signal lines 3 of the cells C1, C2, and C3 of column C, in the circumferential part which is adjacent to the left ends of the cells C1, C2, and C3. The signal lines 3 are extended to the left so as to be connected with the short ring 6c via signal line terminals 3a.

Moreover, in FIG. 1, all the signal lines 3 of each of the cells are connected with any one of the signal-line short rings 6a through 6c; however, it is possible to allow connection with a plurality of signal-line short rings (for example, for each of RGB). Namely, when leakage current is measured between the signal lines 3, or when an electrical inspection is carried out by using a signal responding to a monochrome display inspection of a lighting inspection, it is possible to provide a plurality of signal-line short rings for each 6a through 6c; consequently, higher accuracy can be realized in an electrical inspection.

Further, the scanning-line short rings 5a through 5d are formed in a lower gate layer, and the signal-line short rings 6a through 6c are formed in an upper source layer. Therefore, at the intersections, the scanning-line short rings 5a through 5d and the signal-line short rings 6a through 6c are not electrically connected with one another. Hence, before the inspection, it is not necessary to cut the short rings by using laser, etc. in order to allow the wires to be electrically independent for each of the signal systems.

Furthermore, since the wires are initially formed, all the wires of the collective substrate 1 have been short-circuited to the other wires via the short rings in each of the layers. Therefore, even if one of the wires is charged with static electricity, the static electricity is instantaneously released to the adjacent wire. Hence, it is possible to prevent an extremely high voltage from occurring on a wire which is charged with static electricity, and to prevent an electrical breakdown at the intersection of the wires.

Upon inspection of the collective substrate 1 of the active-matrix substrates, that is formed in the above-mentioned process, firstly, a signal is inputted by using a probe frame (inspection signal supplying means).

In the collective substrate 1 of the present embodiment, it is possible to complete a signal inputting operation merely by inputting inspection signals shown in FIGS. 14(a) through 14(c) into five places of the collective substrate 1. By contrast, in the conventional collective substrate of the active-matrix substrates, the probe frame inputs three signals including a source signal, a gate signal, and an auxiliary capacity wire DC into each of the cells, so that nine cells require twenty seven places for inputting signals, and it is necessary to previously cut wires by using laser for each input type.

Specifically, upon inspection by inputting a signal in the collective substrate 1 of the present embodiment, inspection scanning signals p1 and p2 (FIGS. 14(a) and 14(b)) are respectively inputted from the scanning-line short ring connecting lines 7a and 7b to the scanning lines 2. An inspection display signal p3 (FIG. 14(c)) is inputted from the signal-line short rings 6a, 6b, and 6c to the signal lines 3.

Therefore, the probe frame for this inspection is allowed to have a considerably simple construction as follows: three slim windows (aperture) have lengths in a column direction; namely, the frame has a window exposing the first column cells, a window exposing the second column cells, and a window exposing the third column cells; and five input pins for inputting a signal are set up on the frame. Namely, in the circumferential parts of the frame, three input pins are disposed so as to oppose the scanning-line short ring connecting lines 7a and 7b, and the signal-line short ring 6c. Two input pins are disposed so as to oppose the signal-line short rings 6a and 6b at boundary portions between the windows of the frame.

As described above, in the collective substrate 1 of the active-matrix substrates of the present embodiment, all the scanning lines 2 and the auxiliary capacity wires 4 of the cells are electrically connected by the scanning-line short rings 5a through 5d. The scanning-line short rings 5a and 5c, and the scanning-line short rings 5b and 5d are electrically connected respectively by the scanning-line short ring connecting lines 7a and 7b. Further, all the signal lines 3 of the cells are electrically connected by the signal-line short rings 6a through 6c.

With this arrangement, the collective substrate 1 of the present embodiment makes it possible to simultaneously input the inspection signals to a plurality of cells, so that it is possible to carry out the inspection by using the probe frame whose manufacturing cost is considerably low. Incidentally, the conventional probe frame has been very expensive because the number of windows needs to correspond to that of the cells and the number of input pins needs to increase accordingly.

Further, with regard to the collective substrate 1, when a detecting section scans the cells during an inspection, the cells can be scanned successively along the length of the window, so that it is possible to reduce the non-detection period including an ascending/descending operation of the detecting section. Namely, this arrangement makes it possible to dramatically improve the working efficiency (tact) so as to be considerably favorable for mass production. Incidentally, the conventional method needs to repeat the following operation: prior to the inspection, the detecting section is moved close to the substrate in each of the windows, the detecting section is moved away from the substrate upon completion of the inspection, the detecting section is moved over the frame boundary to another cell, and another inspection is carried out.

Moreover, the probe frame does not prevent the detecting section from moving freely between the cells; thus, it is possible to reduce a non-inspectable area caused by the exterior of the detecting section and the constraint on manufacturing the probe frame; consequently, the inspection performance can be improved.

Furthermore, the smaller the cells become and the more cells are obtained in the collective substrate 1 of the active-matrix substrates, the above-mentioned advantages increase as compared with the conventional art.

Moreover, the present embodiment discusses the construction in which the cell is provided with the auxiliary capacity wires 4 (Cs on Common structure); however, the present embodiment is also applicable to a construction in which the scanning lines 2 of the adjacent pixel substitute for the auxiliary capacity (Cs on Gate structure).

Namely, in the case of the Cs on Gate structure, for example, the scanning-line short rings of one system are connected to even-numbered scanning lines of the cells A1, B1, C1, A3, B3, and C3, and odd-numbered scanning lines of the cells A2, B2, and C2. The scanning-line short rings of the other system are connected to even-numbered scanning lines of the cells A2, B2, and C2, and odd-numbered scanning lines of the cells A1, B1, C1, A3, B3, and C3.

Additionally, unlike the construction in which the auxiliary capacity wires 4 are short-circuited by the scanning-line short rings, this construction results in inconvenience when the scanning lines are short-circuited in the cells. Thus, for example, the following steps can be adopted: the positions of the cutting lines L are changed, the cells are cut out so as to leave the scanning-line short rings on the scanning line terminals, and then, the scanning-line short rings are removed by chamfering.

These steps can be also adopted for the signal-line short rings 6a, 6b, and 6c which bundle the signal lines 3. In order to improve accuracy of the aforementioned inspection, the signal-line short ring can be divided for connecting the even-numbered signal lines and for connecting the odd-numbered signal lines. Additionally, in this case as well, the signal-line short rings of one system is cut out from the short rings by chamfering, etc.

Figure 18:
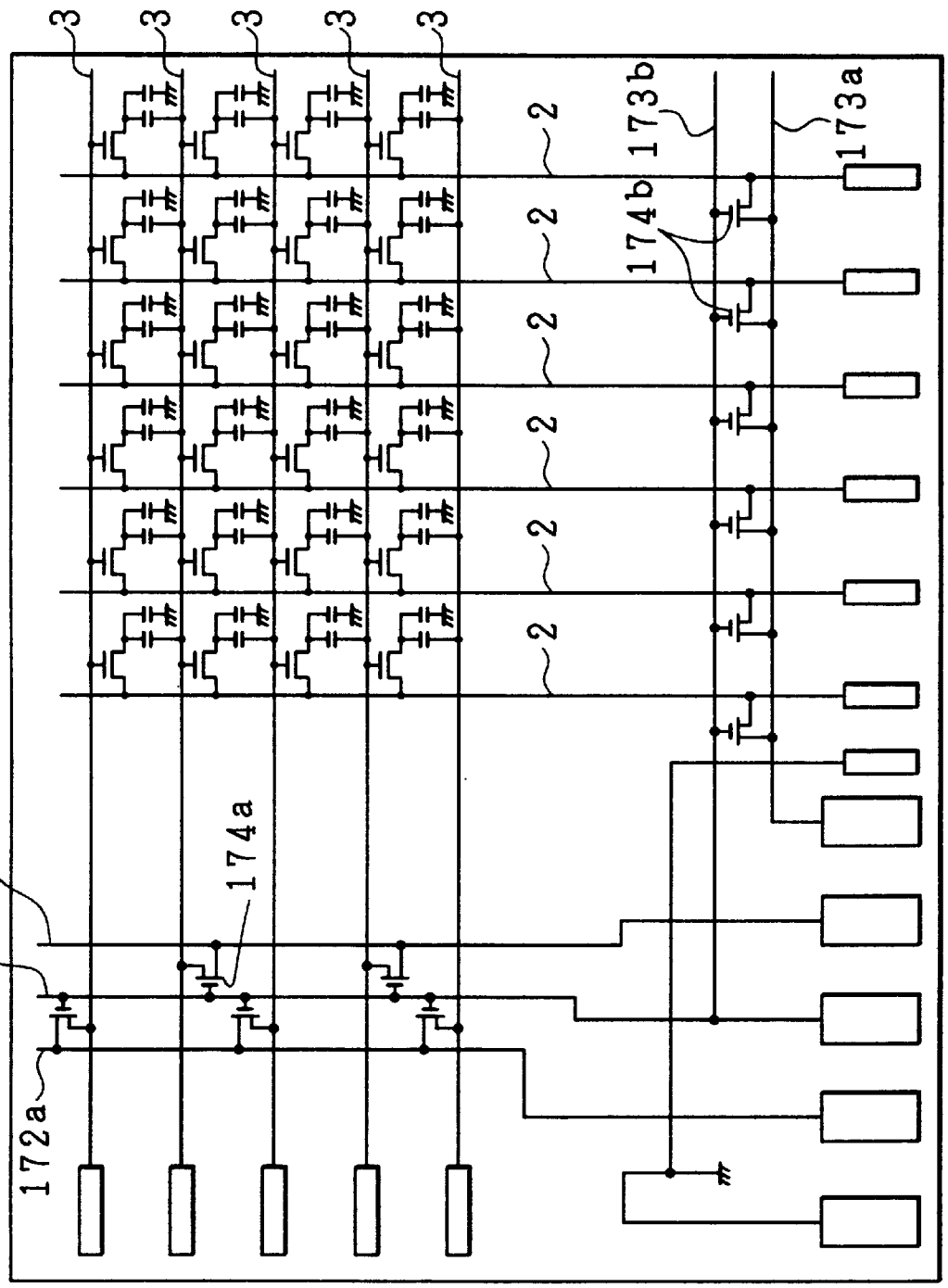
FIG. 18 is an equivalent circuit diagram showing a cell of the conventional active-matrix substrate.

Further, in COG (Chip on Glass) method, in which driver circuits are directly disposed on the terminals, the short rings tend to be connected to the opposite side of the terminals, in view of a space of wires for applying power source voltage to the drivers. In this case, upon cutting out the cells, the short rings remain on the sides where the drivers of the adjacent cells are disposed. If this arrangement does not offer a sufficient space for the wire applying the power source voltage, it is possible to adopt the method disclosed in the Tokukaihei no. 7-333275 (mentioned above), in which instead of the short rings, the inspection signal lines and the inspection scanning lines are connected with the signal lines and the scanning lines. As shown in FIG. 18, this method allows the wires substituting for the short rings to remain in the cells and causes no problem on display without cutting the cells.

Finally, as described above, the collective substrate 1 of the present embodiment is not provided with an inspection signal input pad for each of the cells so as to be advantageous for the electrical inspection. Additionally, the present embodiment offers the following two effects:

Firstly, it is possible to prevent line-shaped unevenness on alignment property, that is caused by the shape of the inspection signal input pad. Namely, upon completion of the active-matrix substrate, the alignment film is rubbed with a cloth so as to align liquid crystal molecules before the active-matrix substrate has been bonded to the opposing substrate. In the case when a larger pattern exists as compared with the other portions in the cell, line-shaped unevenness (so-called rubbing lines) appears on the alignment property. In order to prevent the unevenness, it is desirable to minimize a pattern in the cell; however, minimization of a pattern contradicts a fact in which the largest possible signal input pad is desirable in order to prevent poor contact and to reduce the cost of the probe frame. Therefore, as in the present embodiment, it is effective to dispose no inspection signal input pad in the cell.

Secondary, it is possible to prevent a defect caused by static electricity after completion of the product. Namely, in the case when inspection signals are applied via active elements, it is not necessary to add the step of removing the inspection wires and the signal input pads, from when the inspection is completed until when the product is completed. However, since the inspection signal input pads remain even upon completion of the product, the inspection signal input pads may come into contact with the outside so as to increase the possibility that static electricity damages the active element. The present embodiment does not need to be provided with the signal input pad for each of the cells; therefore, there are less portions which are susceptible to static electricity after completion of the product, resulting in a considerable reduction in a possibility of damaging the active elements.

[EMBODIMENT 2]

Referring to FIGS. 2 and 3, and 14(a) through 14(c), the following explanation describes another embodiment of the present invention. Here, for convenience of explanation, those members that are described in the conventional art and Embodiment 1 are indicated by the same reference numerals and the description thereof is omitted.

Figure 2:
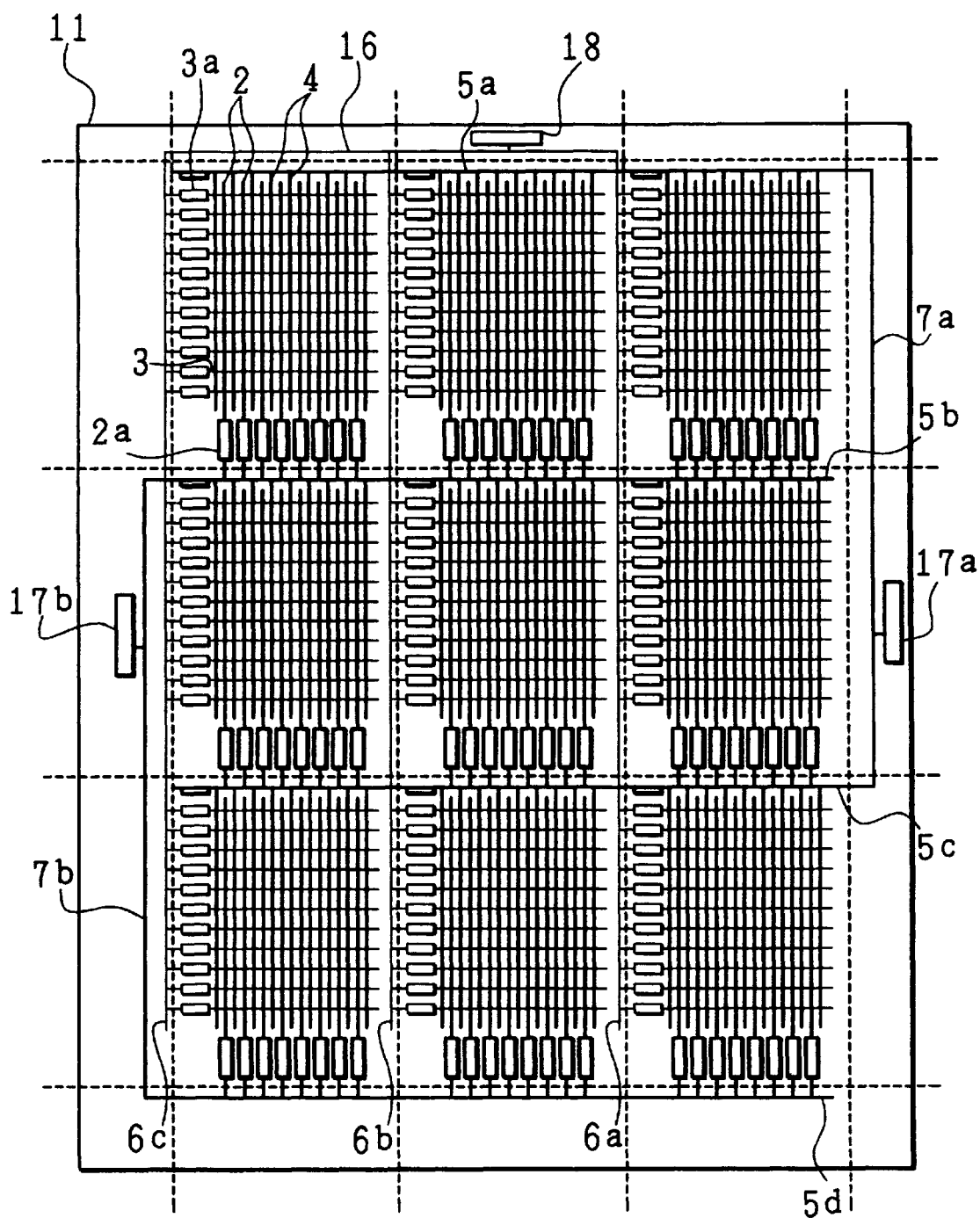
FIG. 2 is a plan model view schematically showing a collective substrate of active-matrix substrates in accordance with another embodiment of the present invention.

FIG. 2 is a plan model view schematically showing a collective substrate of active-matrix substrates in accordance with the present embodiment. Here, in FIG. 2, wires formed on a scanning-line layer are shown by thick lines, and wires formed on a signal-line layer are shown by thin lines.

As shown in FIG. 2, unlike the collective substrate 1 of Embodiment 1, in a collective substrate 11 of the active-matrix substrates of the present embodiment (hereinafter, abbreviated as a collective substrate), signal-line short rings 6a, 6b, and 6c are connected with each other via a short ring connecting line 16, and signal input pads for inputting inspecting signals are disposed in the vicinity of scanning-line short ring connecting lines 7a and 7b and the signal-line short ring connecting line 16.

Specifically, the signal-line short rings 6a, 6b, and 6c are extended to a circumferential part of the collective substrate 11, that is adjacent to the upper ends of the cells B1 and C1, and the signal-line short rings 6a, 6b, and 6c are electrically connected with each other via the signal-line short ring connecting line 16 in the circumferential part. In the circumferential part of the collective substrate 11, in the vicinity of the signal-line short ring connecting line 16, and in the vicinity of scanning-line short ring connecting lines 7a and 7b for respectively connecting scanning-line short rings 5a and 5c and scanning-line short rings 5b and 5d, in order to input an inspection signal, scanning line signal input pads (signal inputting section) 17a and 17b and a signal line signal input pad (signal inputting section) 18 are connected respectively with the connecting lines 7a, 7b and 16. Additionally, since the scanning-line signal input pads 17a and 17b and the signal-line signal input pad 18 are disposed in the circumferential parts of the collective substrate 11, upon cutting along cutting lines L, the scanning-line signal input pads 17a and 17b and the signal-line signal input pad 18 are cut away from the cell, together with the connecting lines 7a, 7b, and 16.

Upon inspecting the collective substrate 11 of the active-matrix substrates having the above-mentioned construction, a probe frame is firstly used for inputting a signal.

In order to input a signal in the collective substrate 11 of the present embodiment, it is merely necessary to input inspection signals of FIGS. 14(a) and 14(b) to three portions of the collective substrate 11.

Specifically, upon a signal input inspection of the collective substrate 11 of the present embodiment, inspection scanning signals p1 and p2 (FIGS. 14(a) and (b)) are respectively inputted from the scanning-line short ring connecting lines 17a and 17b to scanning lines 2. An inspection display signal p3 (FIG. 14(c)) is inputted from the signal-line signal input pad 18 to signal lines 3.

Therefore, a probe frame used for this inspection is allowed to have a significantly simple construction, in which three input pins for inputting a signal are set up on a frame having a window formed so as to surround nine cells. Namely, from the large window at the center of the probe frame, a plurality of cells included in the collective substrate 11 are entirely exposed. Here, in the circumferential parts of the frame, the three input pins are disposed so as to respectively oppose the scanning-line signal input pads 17a and 17b, and the signal-line signal input pad 18.

Moreover, in FIG. 2, the scanning-line signal input pads 17a and 17b, and the signal-line signal input pad 18 are provided. However, in the case when it is not necessary to provide inspection signal input pads, for example, when the scanning-line short ring connecting lines 7a and 7b and the signal-line short ring connecting 16 are sufficiently thick, the inspection can be carried out by inputting the inspection signals directly to the connecting lines 7a, 7b, and 16 without providing any signal input pads.

Further, as shown in FIG. 2, the scanning-line signal input pads 17a and 17b and the signal-line signal input pad 18 are disposed in the circumferential part of the collective substrate 11. For example, the circumferential part has a width of approximately 2 cm from the edge of the collective substrate 11.

Generally, when the active element is formed in the circumferential part of the collective substrate of the active-matrix substrates, the pattern has poor accuracy, so that it is difficult to obtain a favorable property. And, the circumferential part is necessary for handling the collective substrate.

The circumferential part of the collective substrate 11 is a region in which no active element is formed, in other words, a region which is discarded after each of the cells has been cut out from the collective substrate; therefore, it is possible to freely form a pattern including the inspection signal input pads.

Here, in many cases, the inspection signal input pad is formed with a few square $\mu$ms to a few square mms, so that a pattern shift of a few $\mu$ms does not cause any problems. Moreover, even when the film thickness changes by 20 to 30%, the inspection is not affected at all. Therefore, it is possible to form the inspection signal input pads on the circumferential part whose accuracy is relatively poor in the collective substrate.

In view of the above-mentioned facts, the collective substrate 11 of the present embodiment is provided with the scanning-line signal input pads 17a and 17b and the signal-line signal input pad 18 in the circumferential part of the collective substrate 11.

In addition, as described above, the probe frame is expensive, so that it is costly to manufacture a probe frame for each model. Furthermore, the position where the cells are formed in the collective substrate differs for each model.

Therefore, as for each model, the collective substrate 11 of the present embodiment is provided with the inspection signal input pads 17a, 17b, and 18 in a region which has no exterior pattern upon completion of the liquid crystal display device and no display pattern, namely, at positions which are previously determined in common among models in the circumferential part of the collective substrate so as to serve as the positions where the signal input pads are disposed.

With this arrangement, it is possible to inspect any model merely by inputting a signal to each of the signal input pads which are positioned in common among models, and it is possible to inspect a plurality of modes by using a single probe frame; thus, it is not necessary to design a probe frame for each model.

As described above, in the collective substrate 11 of the active-matrix substrates of the present embodiment, all the scanning lines 2 and the auxiliary capacity wires 4 of the respective cells are electrically connected by the scanning-line short rings 5a through 5d. The scanning-line short rings 5a and 5c, and the scanning-line short rings 5b and 5d are electrically connected by the scanning-line short ring connecting lines 7a and 7b respectively. Further, all the signal lines 3 of the respective cells are electrically connected by the signal-line short rings 6a through 6c, and the signal-line short rings 6a through 6c are electrically connected with each other via the signal-line short ring connecting line 16.

With this arrangement, the collective substrate 11 of the present embodiment makes it possible to input the inspection signals to a plurality cells simultaneously, so that it is possible to carry out an inspection by using a probe frame whose manufacturing cost is considerably low. Incidentally, it is proved that the probe frame of the present embodiment can be manufactured at lower cost as compared with the conventional method.

Further, with regard to the collective substrate 11, when a detecting section scans during an inspection, it is possible to continuously scan the entire collective substrate 11, so that a non-detection period including ascending/descending the detecting section can be reduced. Namely, this arrangement makes it possible to dramatically improve the working efficiency (tact) so as to be considerably favorable for mass production.

Further, the probe frame is not provided between the cells, so that it is possible to virtually eliminate the non-inspectable area caused by the interference of the probe frame; consequently, the inspection performance can be improved.

Furthermore, the smaller each of the cells becomes and the more cells are obtained in the collective substrate 11 of the active-matrix substrates, the above-mentioned advantages increase as compared with the conventional art.

As for the collective substrate 11 of the active-matrix substrates of the present embodiment, in the circumferential part of the collective substrate 11, in the vicinity of the signal-line short ring connecting line 16, and in the vicinity of the scanning-line short ring connecting lines 7a and 7b for respectively connecting the scanning-line short rings 5a and 5c and the scanning-line short rings 5b and 5d, in order to input inspection signals, the scanning-line signal input pads 17a and 17b and the signal-line signal input pad 18 are connected respectively with the connecting lines 7a, 7b, and 16.

This arrangement makes it possible to freely dispose the inspection signal input pads regardless of a final form. Hence, for example, it is possible to dispose the pads on positions, which allow an easier input in accordance with the probe frame and the detecting device, to increase and decrease the number of pads in view of a delay of an inspection signal and poor contact of the signal input pads, and to increase the pads in size. Further, as described in Embodiment 1, it is possible to regulate line-shaped unevenness of the alignment property, that is caused by the shape of the signal input pads, by disposing the signal input pads merely on the circumferential parts of the collective substrate 11, without placing the signal input pads in each of the cells.

Moreover, the collective substrate 11 of the active-matrix substrates of the present embodiment is provided with the scanning-line signal input pads 17a and 17b and the signal-line signal input pad 18, which are located in common among different models in the circumferential parts of the collective substrate 11.

As described above, the inspection signal input pads 17a, 17b, and 18 are positioned at portions, in which any display pattern are not formed, in common among models; thus, any model can be inspected by inputting signals merely to the signal input pads 17a, 17b, and 18. Consequently, a single probe frame can inspect a plurality of models. Therefore, it is not necessary to design a probe frame for each of the models so as to manufacture the active-matrix substrate at low cost.

Figure 3:
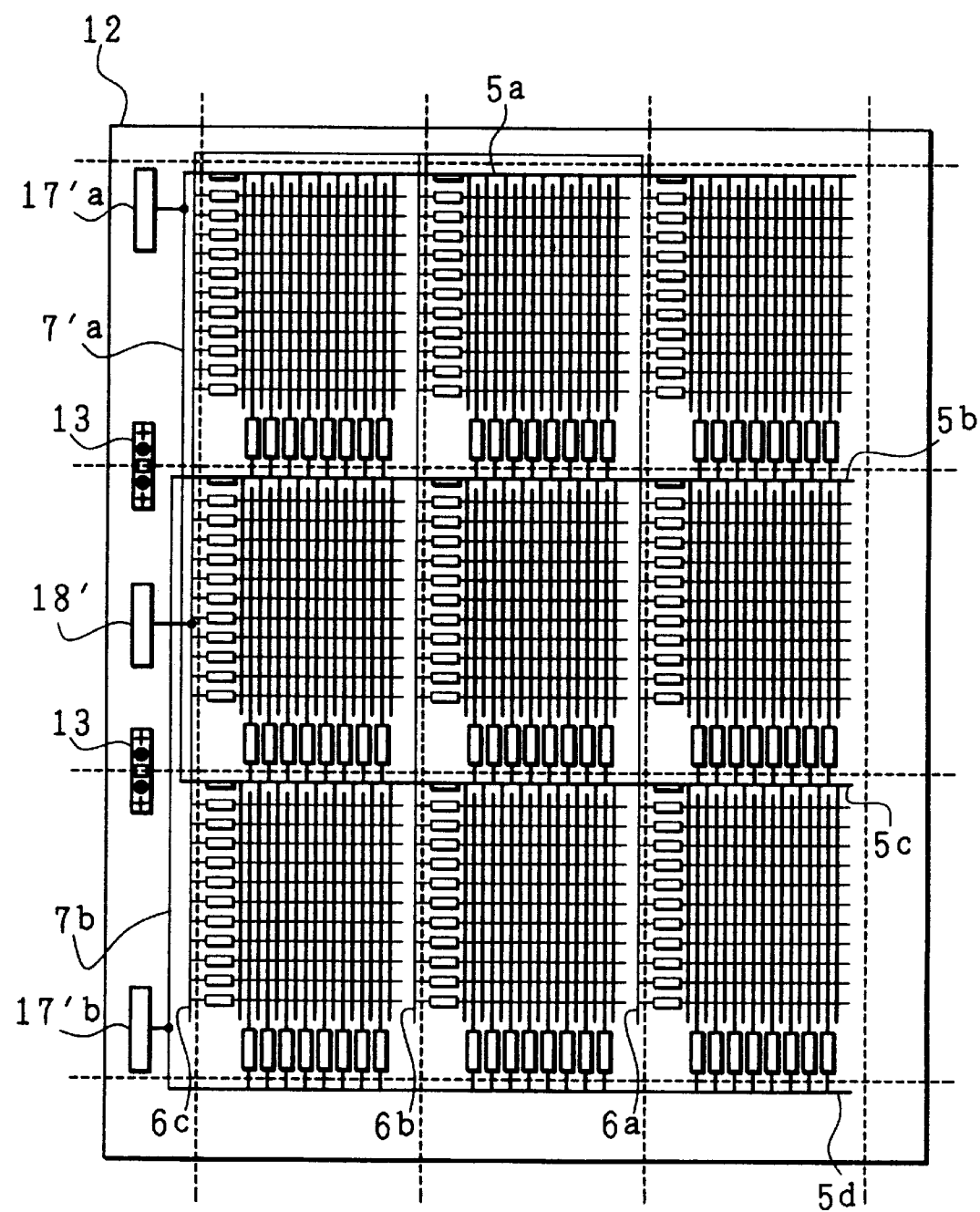
FIG. 3 is a plan model view schematically showing a collective substrate of active-matrix substrates in accordance with still another embodiment of the present invention.

Furthermore, the collective substrate of the active-matrix substrates of the present embodiment is also allowed to have the following construction:

FIG. 3 is a plan model view schematically showing another collective substrate of the active-matrix substrates of the present embodiment. Additionally, in FIG. 3, wires formed on the scanning-line layer are shown by thick lines, and wires formed on the signal-line layer are shown by thin lines.

In a collective substrate 12 of active-matrix substrates (hereinafter, abbreviated as the collective substrate) of FIG. 3, unlike the aforementioned collective substrate 11, marker groups 13 are disposed in the left circumferential part, and scanning-line signal input pads (signal inputting section) 17'a and 17'b and a signal-line signal inputting pad (signal inputting section) 18' are disposed for inputting an inspection signal, at virtually the same distance from the left edge of the collective substrate 12 as the marker groups 13.

Specifically, scanning-line short rings 5a and c are extended to a circumferential part which is adjacent to the left ends of cell C1 and C2 in the collective substrate 12, and are electrically connected with each other via a scanning-line short ring connecting line 7'a in the circumferential part. And in the left circumferential part of the collective substrate 12, in the vicinity of the scanning-line short ring connecting line 7'a, a scanning-line short ring connecting line 7b, and a signal-line short ring 6c, the scanning-line signal input pads 17'a and 17'b and the signal-line signal input pad 18' are disposed so as to be connect respectively to the scanning-line short ring connecting 7'a and 7b, and the signal-line short ring 6c, for inputting inspection signals. Here, the marker group 13 is a group of markers consisting of marks for identifying the substrate and markers for adjusting the position upon bonding the substrate to the opposing substrate. Further, the maker groups 13 are positioned in common among all models, so that any model does not have a repeated pattern of a plurality of cells between the marker groups 13 and the edge of the substrate. Additionally, the collective substrate 12 is provided with the marker groups 13 at two places along the left circumferential part of the collective substrate 12.

Therefore, in the same manner as the aforementioned collective substrate 11, as for the collective substrate 12, it is possible to form the inspection signal input pads 17'a, 17b, and 18' at the same distance from the edge of the substrate as the marker groups 13, or between the maker groups 13 and the edge of the substrate.

Moreover, as described above, the positions of the inspection signal input pads 17'a, 17b, and 18' are determined relative to the positions of the marker groups 13; thus, if the cell forming area of the collective substrate 12 varies so as to change the width of the circumferential part of the substrate, it is possible to inspect a plurality of models by using a single probe frame without causing any problems.

As mentioned above, in the collective substrate 12 of the active-matrix substrates of the present embodiment, the scanning-line signal input pads 17'a, and 17'b and the signal-line signal input pad 18' are formed at the same distance from the substrate edge as the marker groups 13, or between the maker groups 13 and the substrate edge.

As described above, relative to the marker groups 13, the inspection signal input pads 17'a, 17'b, and 18' are positioned at portions, in which any display pattern are not formed, in common among models; thus, any model can be inspected by inputting signals merely to the signal input pads 17'a, 17'b, and 18'. Consequently, a single probe frame can inspect a plurality of models. Therefore, it is not necessary to design a probe frame for each of the models so as to manufacture the active-matrix substrate at low cost.

[EMBODIMENT 3]

Referring to FIGS. 4 through 7, and 14(a) through 14(d), the following explanation discusses still another embodiment of the present invention. Here, for convenience of explanation, those members that are described in the conventional art and Embodiments 1 and 2 are indicated by the same reference numerals and the description thereof is omitted.

Figure 4:
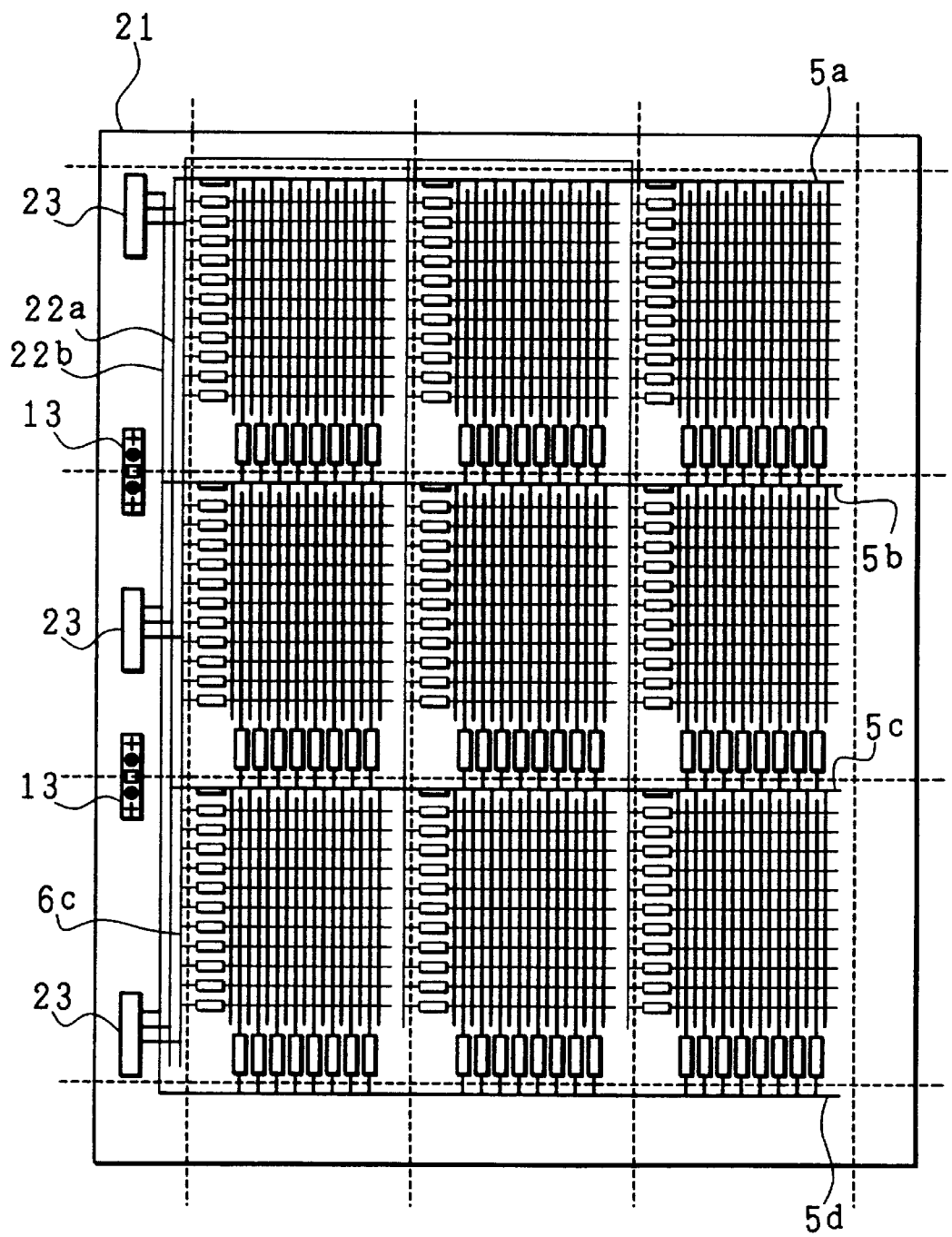
FIG. 4 is a plan model view schematically showing a collective substrate of active-matrix substrates in accordance with still another embodiment of the present invention.

FIG. 4 is a plan model view schematically showing a collective substrate of active-matrix substrates in accordance with the present embodiment. Here, in FIG. 4, wires formed on the scanning-line layer are shown by thick lines, and wires formed on the signal-line layer are shown by thin lines.

As shown in FIG. 4, unlike the collective substrate 13 of Embodiment 2, in a collective substrate 21 of active-matrix substrates of the present embodiment (hereinafter, abbreviated as a collective substrate), signal input pads groups (signal inputting section) 23 are disposed respectively at the positions of scanning-line signal input pads 17'a and 17'b and the signal-line signal input pad 18'. The signal input pad group 23 serves as a single pad group including the scanning-line signal input pads 17'a and 17'b and the signal-line signal input pad 18'.

As described above, in the collective substrate 21, the signal input pads are provided at three places for each of the signal systems. As compared with the aforementioned collective substrate 13, this arrangement needs to increase the number of input pins disposed in a probe frame for inputting a signal, from three to nine; however, in the same manner, this arrangement makes it possible to reduce the cost for manufacturing a probe frame window and to expand the move range of a detecting section. Furthermore, if poor contact occurs between some input pins and the signal input pads, the other inputting places compensate for it, so that the inspection can be normally carried out.

Further, in the case when inputting from a single place overloads an inspection short ring so as to deform a signal waveform because of the high-definition cell, a large number of the cells, and other reasons, it is effective to input signals from a plurality of portions.

Specifically, for example, in the case of forty eight quarter VGA (320×RGB×240) cells formed in the collective substrate, when all the even-numbered lines are simultaneously driven, the load is approximately 700 nF. If the driving is carried out by using merely a single signal input pad and a single inspection short ring, and if the time constant is regulated at approximately 10 μs in order to apply an inspection signal which is close to an actual driving without delay, it is necessary to set the wire resistance of the inspection short ring at approximately 14 Ω. If the cell is constituted by a metal layer whose surface resistance (resistance value which is proportional to the distance and is inversely proportional to the width) is 1 Ωsq (Ω/□), in the case of the collective substrate length of 360 mm long, the width of the wire needs to be 25 mm. It is virtually difficult to satisfy this condition. However, in the collective substrate 21, a plurality of places for inputting signals are provided, so that this problem can be solved.

Figure 5:
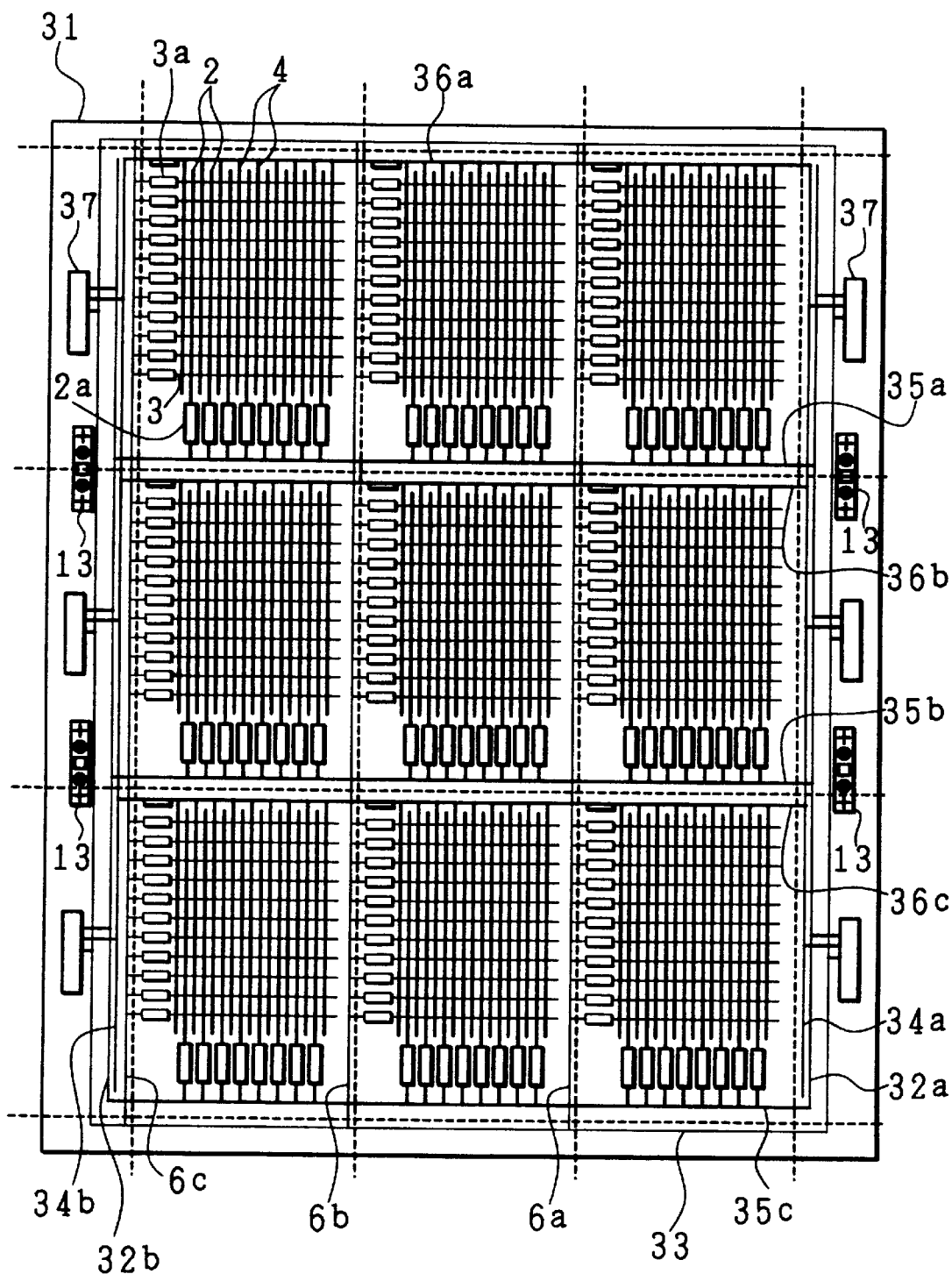
FIG. 5 is a plan model view schematically showing a collective substrate of active-matrix substrates in accordance with still another embodiment of the present invention.

Further, as shown in FIG. 5, a plurality of signal input pad groups are disposed with sufficient distances so as to virtually equalize the loads applied to the respective signal input pad groups; consequently, the above-mentioned advantages further increase. In the collective substrate 31 of the active-matrix substrates of FIG. 5, six signal input pad groups (signal inputting section) 37 are disposed in total in the substrate. In this case, the load per signal input pad is approximately 120 nF, so that it is merely necessary to set the wire resistance and the wire width respectively at not more than 83 Ω and approximately 1.4 mm.

FIG. 5 is a plan model view schematically showing another collective substrate of active-matrix substrates in accordance with the present embodiment. Here, in FIG. 5, wires formed on the scanning-line layer are shown by thick lines, and wires formed on the signal-line layer are shown by thin lines.

As shown in FIG. 5, in the collective substrate 31 of the active-matrix substrates of the present embodiment (hereinafter, abbreviated as the collective substrate), scanning-line short rings (scanning line common wire) 35a, 35b, and 35c are electrically connected by scanning-line short ring connecting line 32a and 32b, auxiliary capacity wire main wires 36a, 36b, and 36c are electrically connected by auxiliary capacity wire main wire connecting lines 34a and 34b, and signal-line short rings 6a, 6b, and 6c are electrically connected by a signal-line short ring connecting line 33. Further, six signal input pad groups 37 are disposed between marker groups 13 and the substrate edge. Three of the signal input pad groups 37 are placed respectively on the left and right circumferential parts of the collective substrate 31.

Specifically, the scanning-line short ring 35a, which is disposed so as to cross the lower ends of the cells A1, B1, and C1, is connected with scanning lines 2 of the cells A1, B1, and C1 via scanning line terminals 2a. The scanning-line short ring 35b, which is disposed so as to cross the lower ends of the cells A2, B2, and C2, is connected with scanning lines 2 of the cells A2, B2, and C2 via the scanning line terminals 2a. The scanning-line short ring 35c, which is disposed so as to cross the lower ends of the cells A3, B3, and C3, is connected with scanning lines 2 of the cells A3, B3, and C3 via the scanning line terminals 2a. The scanning-line short rings 35a, 35b and 35c are respectively extended to the right and left circumferential parts of the collective substrate 31, and are electrically connected with one another via the scanning-line short ring connecting lines 32a and 32b, which are disposed respectively along the right-end cells and left-end cells.

Further, the auxiliary capacity wire main wire 36a, which is disposed so as to cross the upper ends of the cells A1, B1, and C1, is connected with auxiliary capacity wires 4 of the cells A1, B1, and C1. The auxiliary capacity wire main wire 36b, which is disposed so as to cross the upper ends of the cells A2, B2, and C2, is connected with auxiliary capacity wires 4 of the cells A2, B2, and C2. The auxiliary capacity wire main wire 36b, which is disposed so as to cross the upper ends of the cells A3, B3, and C3, is connected with auxiliary capacity wires 4 of the cells A3, B3, and C3. The auxiliary capacity wire main wires 36a, 36b and 36c are respectively extended to the right and left circumferential parts of the collective substrate 31, and are electrically connected with one another via the auxiliary capacity wire main wire connecting lines 34a and 34b, which are disposed respectively along the right-end cells and left-end cells.

Moreover, the signal-line short rings 6a, 6b, and 6c are respectively extended to the upper and lower circumferential parts of the substrate 31 and are electrically connected with one another via the signal-line short ring connecting line 33, which is disposed along the upper-end cells and the lower-ends cells. The signal-line short ring connecting line 33 is a closed wire disposed around the cells A1 through C3 along the four sides of the substrate 31. Hence, the signal-line short rings 6a through 6c are respectively connected with the signal-line short ring connecting line 33 in the upper and lower circumferential parts of the substrate.

Furthermore, each of the right and left circumferential parts of the substrate 31 is provided with two marker groups 13 and three signal input pad groups 37. The marker groups 13 are placed on cutting lines L which is virtually arranged in a lateral direction. The six signal input pad groups 37 are disposed with sufficient distances so as to virtually equalize the loads applied to the respective input pad groups. Namely, in FIG. 5, the signal input pad groups 37 are positioned virtually at the center of the cells A1, A2, A3, C1, C2, and C3, and between the marker groups 13 and the edge of the substrate.

The signal input pad groups 37 are provided with signal input pads for inputting inspection signals to the scanning lines 2, the signal lines 3, and the auxiliary capacity wires 4. Therefore, the signal inputted pad groups 37, which are disposed in the right circumferential part of the collective substrate 31, are electrically connected with the scanning-line short ring connecting line 32a, the signal-line short ring connecting line 33, and the auxiliary capacity wire main wire connecting line 34a. In the same manner, the signal inputted pad groups 37, which are disposed in the left circumferential part of the collective substrate 31, are electrically connected with the scanning-line short ring connecting line 32b, the signal-line short ring connecting line 33, and the auxiliary capacity wire main wire connecting line 34b.

Figure 6:
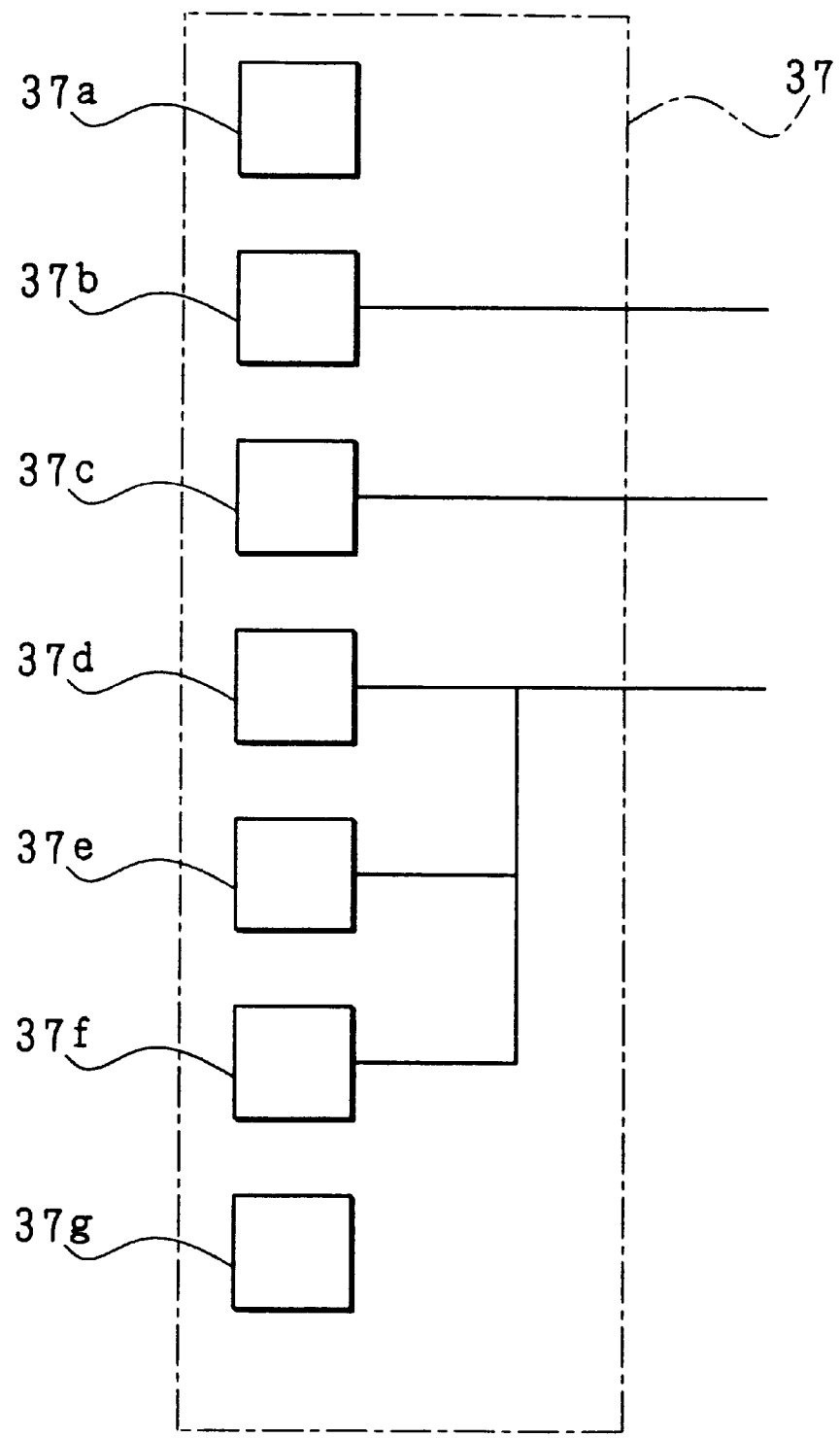
FIG. 6 is a plan model view schematically showing a signal input pad group of the collective substrates of the active-matrix substrates shown in FIGS. 5, and 7 through 10.

Here, referring to FIG. 6, the signal input pad group 37 is fully described. As shown in FIG. 6, the signal input pad group 37 is constituted by seven pads including, from the above of the collective substrate 31, a Go pad 37a, a Ge pad 37b, a Com pad 37c, an R pad 37d, a G pad 37e, a B pad 37f, and an SW pad 37g.

The Go pad 37a and the Ge pad 37b are provided for inputting inspection scanning signals to the odd-numbered and even-numbered scanning lines 2. However, in the collective substrate 31, there is merely a single system for the scanning lines 2, so that the Go pad 37a is not connected to anywhere. The Com pad 37c is provided for inputting auxiliary capacity wire signals to the auxiliary capacity wires 4. The R pad 37d, the G pad 37e, and B pad 37f are provided for inputting inspection display signals to the inspection short rings which respectively correspond to RGB. However, in the collective substrate 31, all the signal lines are short-circuited as a single system without inputting inspection signals to the signal lines 3 for each of the corresponding color types, so that the R pad 37d, the G pad 37e, and the B pad 37f are short-circuited in the vicinity of the pads. The SW pad 37g is provided for inputting a signal which brings an active element into conduction.

As described above, as for the collective substrate 31, among seven pads of the signal input pad group 37, merely three pads of the Ge pad 37b, the Com pad 37c, and the R pad 37d are connected with the wires. Additionally, the other pads are not electrically connected to anywhere; however, the number of pads corresponds to the possible number of the kinds of signal systems; thus, the same probe frame can be adopted even in the case of a different target model to be inspected.

Moreover, unlike the Go pad 37a, the unused G pad 37e and B pad 37f are electrically connected, because even in the event of poor contact on the R pad 37d, a signal can be inputted from the G pad 37e and the B pad 37f without causing any problems. Further, when an inspection signal generating device (not shown) is not fully capable of driving and it is difficult to drive all the signal lines 3 of the collective substrate 31 by using a single signal path without delay, in addition to the outputting path to the R pad 37d, it is possible to input inspection display signals from the outputting paths to the G pad 37e and the B pad 37f.

Hence, when the collective substrate 31 of the present embodiment is inspected by using the probe frame, for example, an inspection scanning signal p2 (FIG. 14(b)) (or an inspection scanning signal p1 (FIG. 14(a)) is inputted to the Ge pad 37b, an inspection display signal p3 (FIG. 14(c)) is inputted to the R pad 37d, and an auxiliary capacity wire signal p4 (FIG. 14(d)) is inputted to the Com pad 37c.

With this arrangement, the inspection scanning signal p2 (or inspection scanning signal pi) is inputted from the Ge pad 37b of the signal input pad group 37 via the scanning-line short ring connecting lines 32a and 32b to the scanning lines 2 of the collective substrate 31. The inspection scanning signal p3 is inputted from the R pad 37d of the signal input pad group 37 via the signal-line short ring connecting line 33 to the signal lines 3 of the collective substrate 31. The auxiliary capacity wire signal p4 is inputted from the Com pad 37c of the signal input pad group 37 via the auxiliary capacity wire main wire connecting lines 34a and 34b to the auxiliary capacity wires 4 of the collective substrate 31.

Here, in the panel having a Cs On Gate construction, the adjacent scanning line serves as an auxiliary capacity wire, so that even upon inspection, the potential of the adjacent scanning line needs to be maintained at the same potential as in the potential-maintaining period, while a signal is written in a pixel on one line. For this reason, the even-numbered scanning lines and the odd-numbered scanning lines are separately short-circuited, and in order to have different timings of turning on, the two kinds of inspection scanning signals p1 and p2 whose timings are different from each other are adopted. Incidentally, FIGS. 1 and 2 show a Cs On Common structure, in which the main wire of the auxiliary capacity wires also serves as the scanning-line short ring of the adjacent cell, so that it is necessary to apply an on-signal to the main wire at a timing which is different from that of the scanning line of the cell. Therefore, like the Cs On Gate structure, the two kinds of signals of the inspection scanning signals p1 and p2 are required. In FIG. 5, etc., the short ring of the scanning line and the main wire of the auxiliary capacity wire are independent from each other, so that it is merely necessary to apply DC voltage (namely, auxiliary capacity wire signal p4) to the auxiliary capacity wires; consequently, merely one of the inspection scanning signal p1 and the inspection scanning signal p2 is required as an inspection scanning signal. Thus, upon inspecting the collective substrate 31, it is possible to use any one of the two inspection scanning signals p1 and p2.

Incidentally, the load applied to the signal lines of the collective substrate considerably varies depending upon the construction of the model included in the collective substrate, and the load exceeds 1 $\mu$F in some cases; therefore, it may be extremely difficult to supply a signal with a small load and a short delay due to the resistance of the inspection short ring and the property of the signal generating device. Consequently, it is effective to previously divide the short ring connecting line into blocks and to apply signals into the blocks, each consisting of a plurality of the divided short ring connecting lines, in the collective substrate so as to successively perform inspections.

Figure 7:
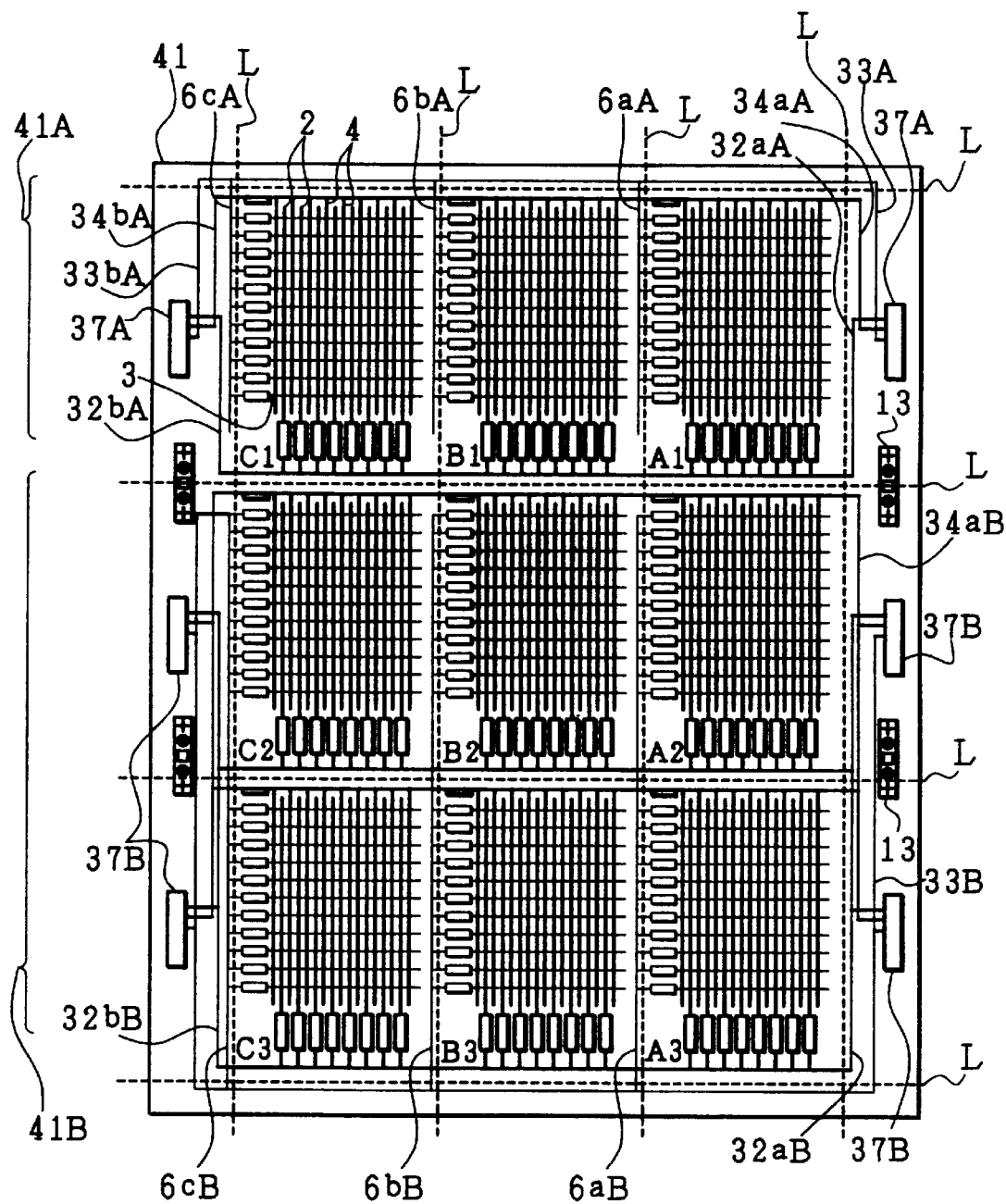
FIG. 7 is a plan model view schematically showing a collective substrate of active-matrix substrates in accordance with still another embodiment of the present invention.

FIG. 7 is a plan model view schematically showing another collective substrate of active-matrix substrates in accordance with the present embodiment. Here, in FIG. 7, wires formed on the scanning-line layer are shown by thick lines, and wires formed on the signal-line layer are shown by thin lines.

As shown in FIG. 7, unlike the collective substrate 31 (FIG. 5), a collective substrate 41 of the active-matrix substrates of the present embodiment (hereinafter, abbreviated as a collective substrate) is constituted by two blocks of a first block (block) 41A including the cells A1, B1, and C1; and a second block (block) 41B including the cells A2, B2, C2, A3, B3, and C3. Here, in each of the blocks, the combination of cells is not limited to that of the present embodiment.

Specifically, on the boundary between the first row and the second row, signal-line short rings 6a, 6b, and 6c are respectively divided into signal-line short rings (signal line common wire) 6aA and 6aB, 6bA and 6bB, and 6cA and 6cB. In the same manner, the scanning-line short ring connecting lines 32a and 32b are respectively divided into scanning-line short ring connecting lines 32aA and 32aB, and 32bA and 32bB; and a signal-line short ring connecting line 33 is divided into signal-line short ring connecting lines 33A and 33B; and auxiliary capacity wire main wire connecting lines 34a and 34b are respectively divided into auxiliary capacity wire main wire connecting lines 34aA and 34aB, and 34bA and 34bB.

Therefore, an inspection signal is inputted to each of the cells of the first block 41A of the collective substrate 41 as follows: an inspection scanning signal p2 (or inspection scanning signal p1) is inputted from a Ge pad 37b of a signal input pad g roup (signal inputting section) 37A via the scanning-line short ring connecting lines 32aA and 32bA to scanning lines 2. An inspection display signal p3 is inputted from an R pad 37d of a signal input pad group 37A via the signal-line short ring connecting lines 33A to signal lines 3. An inspection sca nning signal p4 is inputted from a Com pad 37c of a signal input pad group 37A via the auxiliary capacity wire main wire connecting lines 34aA and 34bA to auxiliary capacity wires 4.

In the same manner, an inspection signal is inputted to each of the cells of the first block 41B of the collective substrate 41 as follows: the inspection scanning signal p2 (or inspection scanning signal p1) is inputted from the Ge pad 37b of the signal input pad group (signal inputting section) 37B via the scanning-line short ring connecting lines 32aB and 32bB to scanning lines 2. An inspection display signal p3 is inputted from the R pad 37d of the signal input pad group 37B via the signal-line short ring connecting lines 33B to signal lines 3. An inspection scanning signal p4 is inputted from the Com pad 37c of the signal input pad group 37B via the auxiliary capacity wire main wire connecting lines 34aB and 34bB to auxiliary capacity wires 4.

The inspections are carried out as follows: signals are inputted from the signal input pad group 37A to the first block 41A of the collective substrate 41, an electrical inspection is performed, and then, signals are inputted from the signal input pad group 37B to the second block 41B of the collective substrate 41 and an electrical inspection is performed.

Additionally, while the detecting section of the detecting device continues to scan, it is merely necessary to electrically switch the supply of signals by using a relay circuit, etc.; thus, there is no possibility of a reduction in working efficiency (tact).

Moreover, even if each of the blocks has a different model on the same collective substrate, without depending upon the mixed kinds of models, this method makes it possible to swiftly perform an electrical inspection with the same probe frame on a large-format collective substrate merely by electrically switching the supply of signals. Therefore, for example, the Cs on Gate structure model and the Cs on Common structure model can coexist on the same collective substrate, or a monochrome display model and a color display model can coexist on the same collective substrate.

Furthermore, as described above, in addition to the aforementioned model in which the signal input pad groups 37 are directly short-circuited to inspection short rings, it is possible to provide a model which supplies inspection signals via active elements. Here, upon inspecting the model which supplies inspection signals via active elements, from the SW pad 37g (FIG. 6) of the signal input pad group 37, a signal is inputted so as to bring the active elements into conduction.

As described above, in the collective substrate 31 of the active-matrix substrates of the present embodiment, a plurality of signal input pad groups 37, each being provided with signal inputting pads for inputting the respective inspection signals, are disposed so as to virtually equalize the loads of the allocated common wires.

With this arrangement, a plurality of signal input pads are provided for one signal system, so that even when some signal input pads have poor contact, inspection signals from the other signal input pads can compensate for the defected signal input pads so as to carry out the inspection without causing any problems.

Further, when the load applied to the common wire is too large, a signal delay occurs in accordance with the resistance value of the common wire; however, a plurality of signal input pads are provided so as to overcome this problem. And then, a plurality of signal input pads are disposed so as to virtually equalize the loads of the allocated common wires; therefore, the effect is enhanced.

Furthermore, in the collective substrate 41 of the active-matrix substrates of the present embodiment, the cells are divided into a plurality of blocks, and each of the blocks is provided with the scanning-line short ring connecting lines, the signal-line short ring connecting line, the auxiliary capacity wire main wire connecting lines, and the signal input pad groups.

This arrangement makes it possible to input inspection signals to each of the blocks. Thus, even when a heavy load is required to simultaneously drive the entire substrate and a signal delay occurs due to an output impedance of a driving circuit, some of the divided blocks can be driven; consequently, it is possible to design the driving circuit in a simple manner and to prevent an increase in the cost.

Further, the cells are divided into blocks so as to reduce the load capacity; therefore, even in the case of an insufficient width of the inspection short ring, it is possible to readily supply inspection signals without delay.

[EMBODIMENT 4]

Referring to FIGS. 8 through 10, and 14(a) through 14(d), the following explanation describes still another embodiment of the present invention. Here, for convenience of explanation, those members that are described in the conventional art and Embodiments 1 through 3 are indicated by the same reference numerals and the description thereof is omitted.

Figure 8:
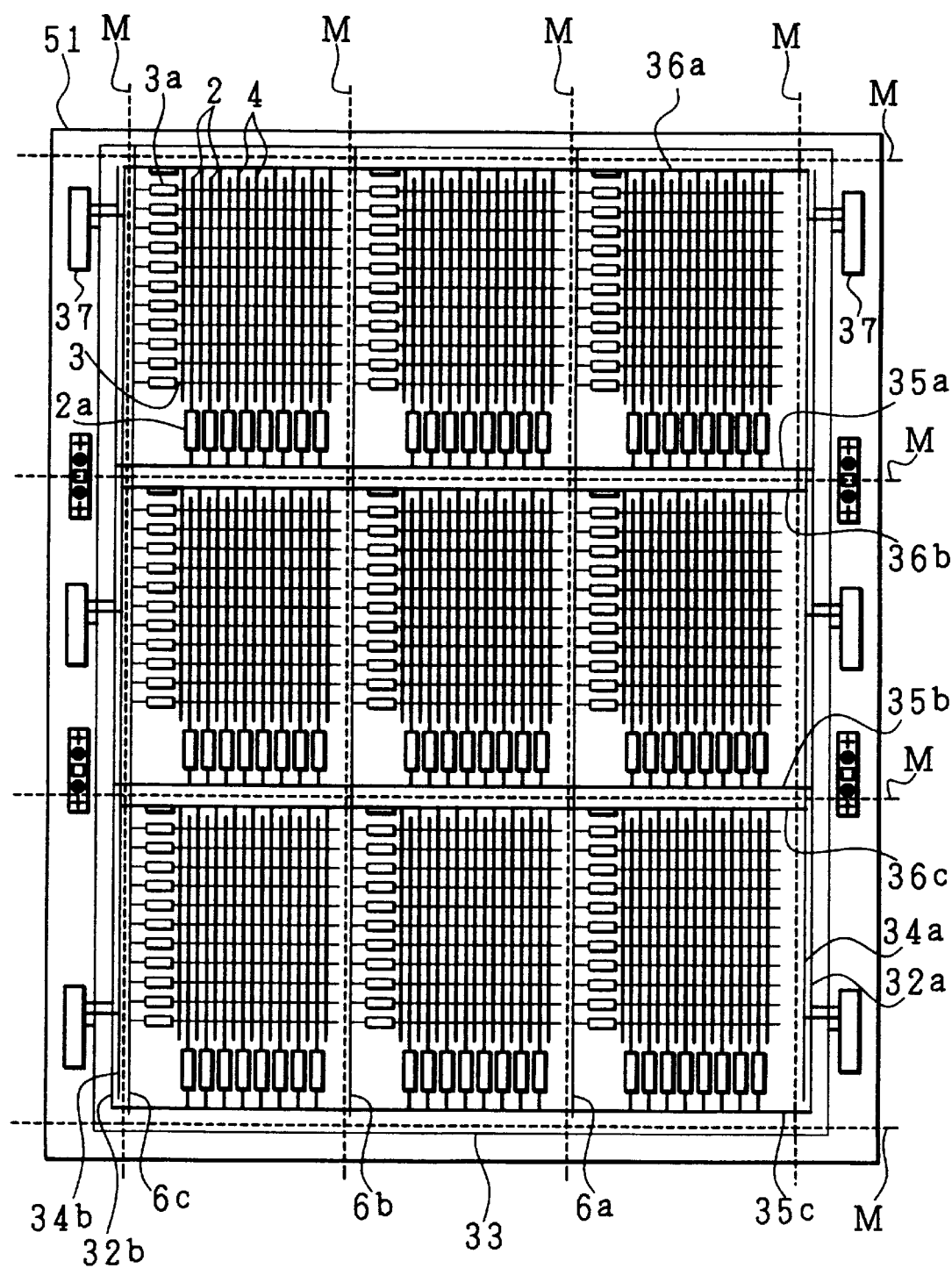
FIG. 8 is a plan model view schematically showing a collective substrate of active-matrix substrates in accordance with still another embodiment of the present invention.

FIG. 8 is a plan model view schematically showing a collective substrate of active-matrix substrates in accordance with the present embodiment. Here, in FIG. 8, wires formed on the scanning-line layer are shown by thick lines, and wires formed on the signal-line layer are shown by thin lines.

As shown in FIG. 8, a collective substrate 51 of the active-matrix substrates of the present embodiment (hereinafter, abbreviated as a collective substrate) has the same construction including wires and terminals as the collective substrate 31 (FIG. 5) of Embodiment 3, except for different positions of cutting lines for cutting out the cells.

Namely, like the aforementioned collective substrate 31, the collective substrate 51 is provided with inspection wires (scanning-line short rings 35a through 35c, scanning-line short ring connecting lines 32a and 32b, signal-line short rings 6a through 6c, a signal-line short ring connecting line 33, auxiliary capacity wire main wires 36a through 36c, and auxiliary capacity wire main wire connecting lines 34a and 34b), which connect lines for each of the signal systems (scanning line 2, signal line 3, and auxiliary capacity wire 4) of the cells. The collective substrate is also provided with a plurality of signal input pad groups 37 at positions in common among models so as to virtually equalize the loads allocated to the respective signal input pad groups 37, each including signal input pads (Ge pad 37b, Com pad 37c, and R pad 37d(FIG. 6)) for inputting inspection signals (inspection scanning signals p1 and p2, inspection display signal p3, and auxiliary capacity wire signal p4 (FIGS. 14(a) through 14(d)).

Further, as for the collective substrate 51 of the present embodiment, upon cutting out each of the cells, the cutting operation is performed along cutting lines M. Especially, as for a longitudinal cutting direction in the figures, the cutting lines L are positioned between the signal-line short rings 6a through 6c and the signal line terminals 3a; meanwhile, the cutting lines M are positioned outside the signal-line short rings 6a through 6c (on the left of FIG. 8). Thus, the signal-line short rings 6a through 6c, which are cut along the cutting lines M for each of the cells, remain in each of the cells so as to be connected with the signal lines 3 in the cells.

Namely, after the cutting operation along the lines M, the scanning lines 2, the signal lines 3, and the auxiliary capacity wires 4 are not cut away from the scanning-line short rings 35a through 35c, the signal-line short rings 6a through 6c, and the auxiliary capacity wire main wires 36a through 36c, so that the scanning lines 2, the signal lines 3, and the auxiliary capacity wires 4 are not electrically independent from one another.

As described above, in the collective substrate 51, the inspection wires provide a common connection upon performing an electrical inspection on a large-format substrate. And then, the collective substrate 51 is bonded to the opposing substrate and is cut and divided along the cutting lines M.

In this case, the scanning-line short rings 35a through 35c and the signal-line short rings 6a through 6c remain in the cells so as to respectively provide common connections for the scanning lines 2 and the signal lines 3; and the auxiliary capacity wire main wires 36a through 36c remain in the cells so as to serve as main wires for bundling the auxiliary capacity wires 4. Meanwhile, the wires for short-circuiting signal lines of the same system between the cells or between the blocks (scanning-line short ring connecting lines 32a and 32b, signal-line short rings connecting line 33, and the auxiliary capacity wire main wire connecting lines 34a and 34b) are disposed on the circumferential parts (region in which no repeated pattern of the cell is formed) of the collective substrate 51. The circumferential parts are discarded after the cutting operation. Therefore, any problems do not appear in the following inspection, and no unnecessary pattern is left in the cell upon completion of the liquid crystal display device.

Further, upon completion of the panel, a lighting inspection is carried out on the divided cells; thus, for inputting signals, it is desirable to allow the scanning-line short rings 35a through 35c and the signal-line short rings 6a through 6c to remain. Namely, in an inspection for large-format substrate, the wires connecting the cells are cut by dividing along the cutting lines M; however, no inconvenience is imposed upon performing a lighting inspection on each of the cells. Moreover, it is not necessary to inspect for unnecessary patterns of the cells so as to obtain cells which are identical in form. Additionally, the short rings remain after the cutting operation so as to protect the cells from static electricity.

Furthermore, in view of convenience of the large-format inspection and the cell inspection, the collective substrate 51 has the signal-line short rings and the auxiliary capacity wires formed in different layers at the intersections thereof; thus, the signal systems are electrically separated from each other after the cutting operation of the cells, so that it is not necessary to add the step of cutting the short rings before inspection.

After the lighting inspection, in the same manner as the conventional inspecting method, the scanning-line short rings 35a through 35c and the signal-line short rings 6a through 6c are removed by chamfering, etc. before installing the external driving circuit, so that the scanning lines 2 and the signal lines 3 are electrically independent from one another.

Figure 9:
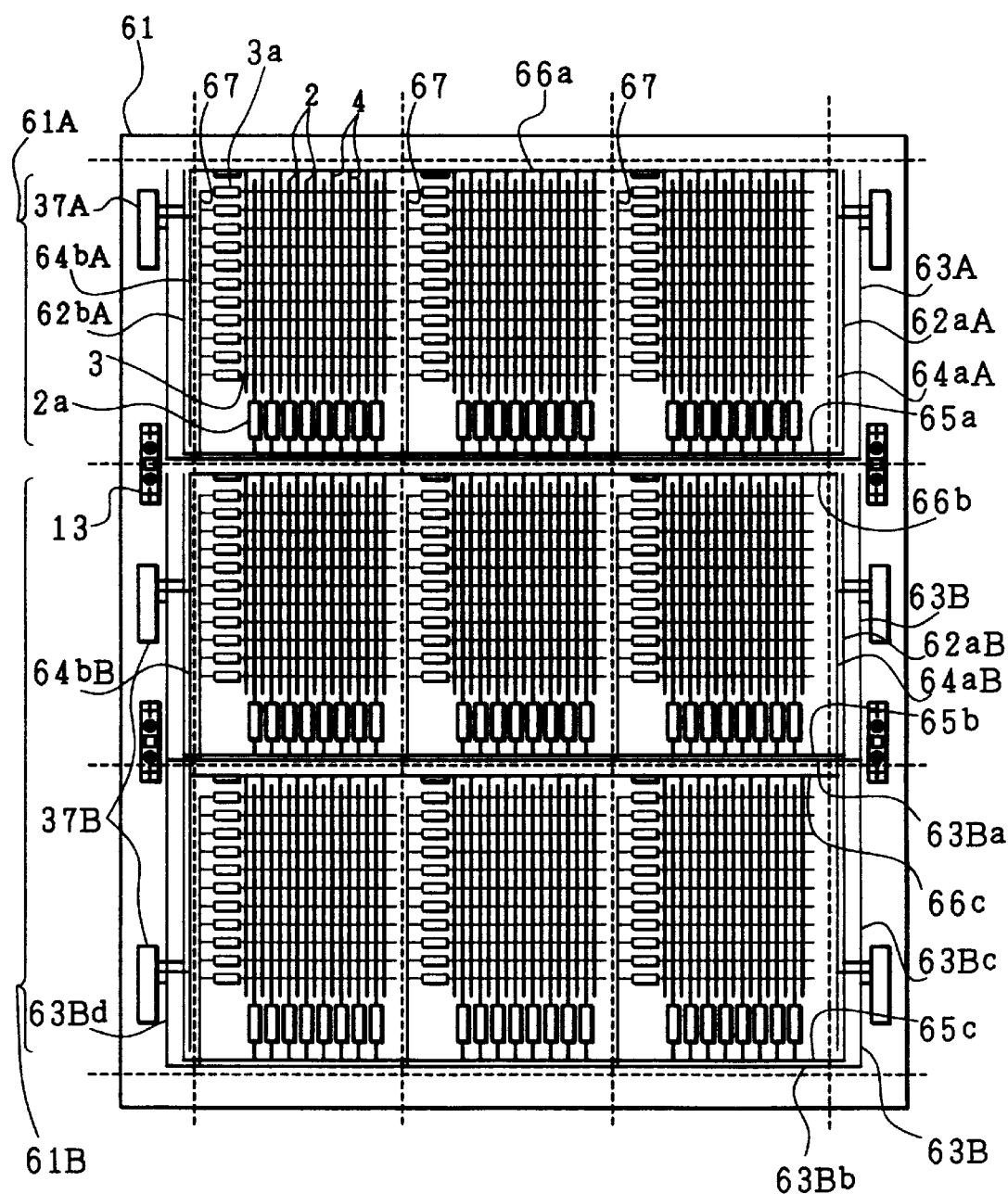
FIG. 9 is a plan model view schematically showing a collective substrate of active-matrix substrates in accordance with still another embodiment of the present invention.

Moreover, the collective substrate of the active-matrix substrates of the present embodiment is also allowed to have the following construction:

FIG. 9 is a plan model view schematically showing a collective substrate of active-matrix substrates in accordance with the present embodiment. Here, in FIG. 9, wires formed on the scanning-line layer are shown by thick lines, and wires formed on the signal-line layer are shown by thin lines.

As shown in FIG. 9, as compared with the collective substrate 41 (FIG. 7) of Embodiment 3, a collective substrate 61 of the active-matrix substrates of the present embodiment (hereinafter, abbreviated as a collective substrate) has virtually the same construction including wires and terminals except for the positions of cutting lines for cutting out the cells.

Further, unlike the aforementioned collective substrate 51 (FIG. 8), in the collective substrate 61, the cells are divided into a plurality of blocks, and each of the blocks is provided with signal wires and signal input pad groups. Specifically, the collective substrate 61 is constituted by two blocks of a first block (block) 61A including the cells A1, B1, and C1; and a second block (block) 61B including the cells A2, B2, C2, A3, B3, and C3. Here, in each of the blocks, the combination of cells is not limited to that of the present embodiment.

In each of the cells, signal lines 3 are connected with signal-line short rings (signal-line common wire) 67, which are disposed along the left ends of the cells, via signal line terminals 3a.

The wires of the first block 61A are arranged as follows: in the cells A1, B1, and C1, the scanning lines 2 are connected with a scanning-line short ring (scanning-line common wire) 65a which is disposed so as to cross the lower ends of the cells A1, B1, and C1, via scanning line terminals 2a. In the cells A1, B1, and C1, auxiliary capacity wires 4 are connected with an auxiliary capacity wire main wire 66a, which is disposed so as to cross the upper ends of the cell A1, B1, and C1.

Further, the scanning short ring 65a and the auxiliary capacity wire main wire 66a are extended to the right and left circumferential parts of the collective substrate 61. Via scanning-line short rings connecting lines 62aA and 62bA and auxiliary capacity wire main wire connecting lines 64aA and 64bA which are disposed along the right-end cell A1 and the left-end cell C1, the scanning short ring 65a and the auxiliary capacity wire main wire 66a are respectively connected with signal input pad groups 37A, which are disposed at predetermined positions of the right and left circumferential parts of the substrate. In the cells A1, B1, and C1, the signal-line short rings 67 are connected with a sinal-line short ring connecting line 63A which is disposed so as to cross the lower ends of the cells A1, B1, and C1 between the right and left circumferential parts of the substrate 61. Further, in the circumferential parts of the substrate, the signal-line short ring connecting line 63A is disposed along the right-end A1 and the left-end C1, and is connected with the right and left signal input pad groups 37A.

In the same manner, the wires of the second block 61B are arranged as follows: in the cells A2, B2, and C2, scanning lines 2 are connected with a scanning-line short ring (scanning-line common wire) 65b which is disposed so as to cross the lower ends of the cells A2, B2, and C2, via scanning line terminals 2a. In the cells A2, B2, and C2, auxiliary capacity wires 4 are connected with an auxiliary capacity wire main wire 66b, which is disposed so as to cross the upper ends of the cells A2, B2, and C2.

Further, in the cells A3, B3, and C3, scanning lines 2 are connected with a scanning-line short ring (scanning-line common wire) 65c which is disposed so as to cross the lower ends of the cells A3, B3, and C3, via scanning line terminals 2a. In the cells A3, B3, and C3, auxiliary capacity wires 4 are connected with an auxiliary capacity wire main wire 66c, which is disposed so as to cross the upper ends of the cells A3, B3, and C3.

Furthermore, the scanning-line short rings 65b and 65c and the auxiliary capacity wire main wires 66b and 66c are extended to the right and left circumferential parts of the collective substrate 61. Via scanning-line short ring connecting lines 62aB and 62bB and the auxiliary capacity wire main wire connecting lines 64aB and 64bB, which are dispose along the right-end and left-end cells A2, A3, C2, and C3, the scanning-line short rings 65b and 65c and the auxiliary capacity wire main wires 66b and 66c are respectively connected with the signal input pad groups 37B. The right and left circumferential parts of the substrate are respectively provided with two of the signal input pad groups 37B at the predetermined positions.

Further, in the cells A2, B2, and C2, the signal-line short rings 67 are connected with a common wire 63Ba which is disposed so as to cross the lower ends of the cells A2, B2, and C2 between the right and left circumferential parts of the substrate 61. Furthermore, the signal-line short rings 67 of the cells A3, B3, and C3 are connected with a common wire 63Bb which is disposed so as to cross the lower ends of the cells A3, B3, and C3 between the right and left circumferential parts of the substrate 61. The common wires 63Ba and 63Bb are extended to right and left circumferential parts of the collective substrate 61 and are connected with connecting lines 63Bc and 63Bd which are disposed along the right-end and left-end cells A2, A3, C2, and C3. Further, the connecting lines 63Bc and 63Bd are respectively connected with the signal input pad groups 37B. The right and left circumferential parts of the substrate are respectively provided with two of the signal input pad groups 37B at the predetermined positions. Additionally, the wire constituted by the common wires 63Ba and 63Bb, and the connecting lines 63Bc and 63Bd is a signal-line short ring connecting line 63B.

Therefore, as for an inspection performed on the collective substrate 61 of the present embodiment, an inspection signal is inputted by using a probe frame as follows: an inspection signal p2 (FIG. 14(b)) (or an inspection scanning signal p1 (FIG. 14(a))) is inputted from Ge pads 37b of the signal input pad groups 37A and 37B via the scanning-line short ring connecting lines 62aA, 62bA, 62aB, and 62bB to the scanning lines 2. An inspection display signal p3 (FIG. 14(c)) is inputted from R pads 37d of the signal input pads 37A and 37B via the signal-line short rings connecting lines 63A and 63B to the signal lines 3. An auxiliary capacity wire signal p4 (FIG. 14(d)) is inputted from Com pads 37c of the signal input pad groups 37A and 37B via the auxiliary capacity-wire main wire connecting lines 64aA, 64bA, 64aB, and 64bB to the auxiliary capacity wires 4.

Further, in the same manner as the collective substrate 51 (FIG. 8), the collective substrate 61 is cut along cutting lines M.

As described above, in the collective substrate 61, the scanning-line short ring connecting line, signal-line short ring connecting line, and the auxiliary capacity wire main wire connecting line are cut at the boundary between the first-row cells and second-row cells, and the cells are divided into a plurality of blocks.

Namely, for each signal system, the blocks are connected by a between-block short circuit wire as a single block group, so that the active-matrix substrate is divided into a plurality of block groups. Additionally, the block group can be constituted by a plurality of blocks or a single block.

Moreover, the collective substrate 61 is provided with the signal input pads, which input inspection signals to the common wire and the between-block short circuit wire of each of the blocks, at positions in common among models.

Figure 10:
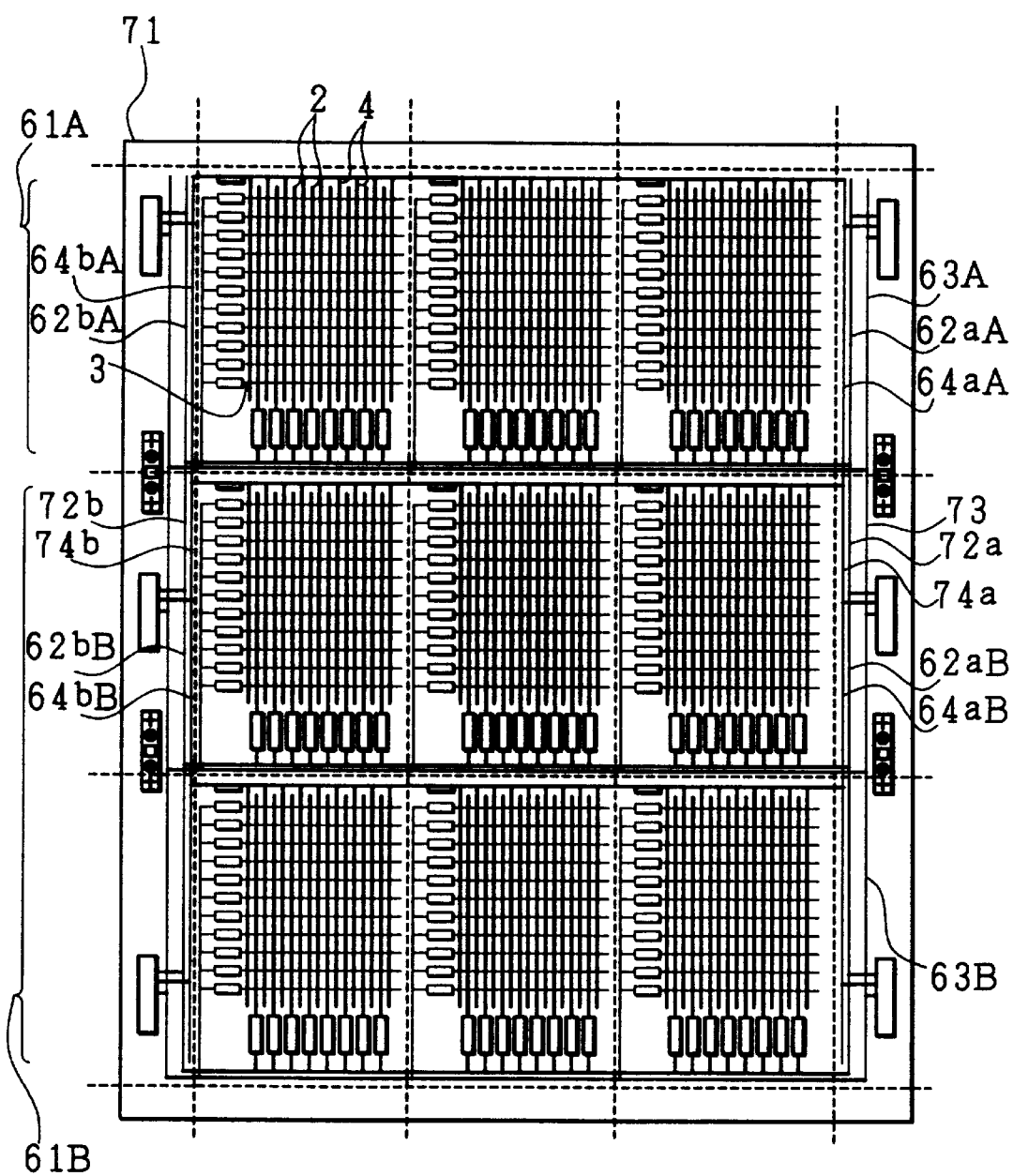
FIG. 10 is a plan model view schematically showing a collective substrate of active-matrix substrates in accordance with still another embodiment of the present invention.

Additionally, as an intermediate construction between the collective substrate 51 (FIG. 8) and the collective substrate 61 (FIG. 9), the following construction is also available:

FIG. 10 is a plan model view schematically showing another collective substrate of active-matrix substrates in accordance with the present embodiment. Here, in FIG. 10, wires formed on the scanning-line layer are shown by thick lines, and wires formed on the signal-line layer are shown by thin lines.

As shown in FIG. 10, a collective substrate 71 of the active matrix substrates of the present embodiment (hereinafter, abbreviated as a collective substrate) has a construction in which wires of the collective substrate 61 (FIG. 9) are connected for each signal system between the blocks.

Specifically, scanning-line short ring connecting lines 62aA and 62bA, which are connected to scanning lines 2 of a first block 61A, are respectively connected with scanning-line short ring connecting lines 62aB and 62bB, which are connected to scanning lines 2 of a second block 61B, at the boundary between the first and the second rows, in the same manner as the scanning-line short ring connecting lines 32a and 32b (FIG. 8). Here, the scanning-line short ring connecting lines 62aA and 62aB are connected with each other and serve as a scanning-line between-block short circuit 72a; and the scanning-line short ring connecting lines 62bA and 62bB are connected with each other and serve as a scanning-line between-block short circuit wire 72b.

In the same manner, signal-line short ring connecting lines 63A, which are connected to signal lines 3 of the first block 61A, are connected with signal-line short ring connecting lines 63B and 62bB, which are connected to signal lines 3 of the second block 61B, at the boundary between the first and the second rows, in the same manner as the signal-line short ring connecting lines 33 (FIG. 8). Here, the signal-line short ring connecting lines 63A and 63B are connected with each other and serve as a signal-line between-block short circuit wire 73.

Auxiliary capacity wire main wire connecting lines 64aA and 64bA, which are connected to auxiliary capacity wires 4 of the first block 61A, are connected with auxiliary capacity wire main wire connecting lines 64aB and 64bB, which are connected to auxiliary capacity wires 4 of a second block 61B, at the boundary between the first and the second rows, in the same manner as the auxiliary capacity wire main wire connecting lines 34a and 34b (FIG. 8). Here, the auxiliary capacity wire main wire connecting lines 64aA and 64aB are connected with each other and serve as an auxiliary capacity wire between-block short circuit wire 74a; and the auxiliary capacity wire main wire connecting lines 64bA and 64bB are connected with each other and serve as a scanning-line between-block short circuit wire 74b.

Further, in the same manner as the collective substrate 51 (FIG. 8), the collective substrate 71 is cut along cutting lines M.

As described above, the collective substrate 71 is divided into a plurality of blocks (first block 61A and second block 61B), in which the cells are connected by inspection wires for each of the signal systems. Furthermore, via the between-block short circuit wires (scanning-line between-block short circuit wires 72a and 72b, signal-line between-block short circuit wire 73, and auxiliary capacity wire between-block short circuit wires 74a and 74b), the wires are connected between the blocks for each of the signal systems. Further, as for each of the between-block short circuit wires, a plurality of signal input pad groups 37 are provided at positions in common among models, in the circumferential parts of the collective substrate 71.

This arrangement makes it possible to adopt a probe frame which has input pins opposing the signal input pad groups 37 so as to input signals to a plurality of blocks and a plurality of cells. For this reason, even when the cells have different constructions or when the model is changed, it is possible to carry out an inspection by using the same probe frame; consequently, the active-matrix substrate can be manufactured with higher efficiency at low cost.

As described above, as for the collective substrate of the active-matrix substrates of the present embodiment, upon cutting out the cells, the cutting operation is performed along the cutting lines M so that the scanning-line short rings and the signal-line short rings remain in the cells.

With this operation, in the cell that has been cut out, the scanning lines 2 and the signal lines 3 are connected respectively by the scanning-line short ring and the signal-line short ring so as to readily carry out a lighting inspection. Moreover, it is not necessary to inspect for unnecessary patterns of the cells so as to obtain cells which are identical in form. Additionally, the short rings remain after the cutting operation so as to protect the cells from static electricity.

[EMBODIMENT 5]

Figure 11:
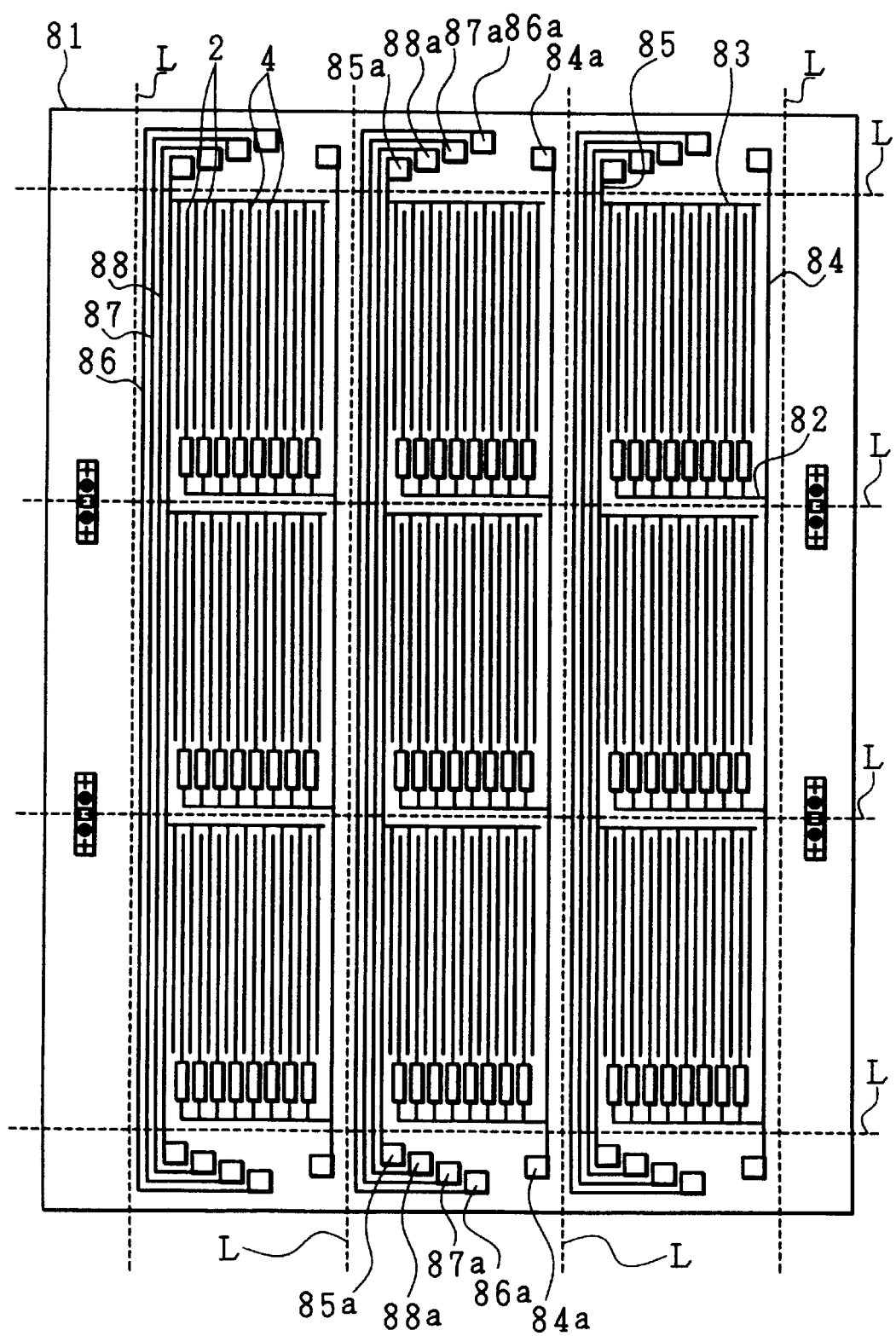
FIG. 11 is a plan model view schematically showing a scanning-line layer of a collective substrate of active-matrix substrates in accordance with still another embodiment of the present invention.

Referring to FIG. 11, the following explanation describes still another embodiment of the present invention. Here, for convenience of explanation, those members that are described in the conventional art and Embodiments 1 through 4 are indicated by the same reference numerals and the description thereof is omitted.

FIG. 11 is a plan model view of a collective substrate of active-matrix substrates of the present embodiment. Here, FIG. 11 shows merely wires formed in the layer of scanning lines. In the actual construction, signal lines are formed in another layer so as to intersect the scanning lines (laterally in FIG. 11).

As shown in FIG. 11, as for a collective substrate 81 of the active-matrix substrates of the present embodiment (hereinafter, abbreviated as a collective substrate), in each of the cells, a scanning-line common wire, an auxiliary capacity wire common wire, and a signal-line common wire are formed in the scanning-line layer.

Specifically, the wires are formed in the scanning-line layer of the collective substrate 81 as follows:

In each of the cells, a scanning-line common wire 82, which is disposed along the lower end of the cell, is connected with all scanning lines 2 of the cell via scanning-line terminals 2a. Further, each of the scanning-line common wires 82 is connected with a scanning-line common wire connecting line 84 which is provided for each cell column. Namely, a scanning-line common wire connecting line 84, which is disposed so as to run through the right ends of the cells A1, A2, and A3 of A column, is connected with three scanning-line common wires 82 of the A-column cells. Further, the scanning-line common wire connecting line 84 is extended to the upper and lower circumferential parts of the collective substrate 81. The circumferential parts are respectively adjacent to the upper end of the cell A1 and the lower end of the cell A3. And the scanning-line common wire connecting line 84 is connected with terminals (signal inputting section) 84a in the circumferential parts. In the same manner, in the cells B1, B2, and B3 of B column and in the cells C1, C2, and C3 of C column, the scanning-line common wires 82, which are connected with the scanning lines 2, are bundled by the scanning-line common wire connecting line 84 and are connected with the terminals 84a.

Moreover, in each of the cells, an auxiliary capacity wire common wire 83, which is disposed along the upper end of the cell, is connected with all auxiliary capacity wires 4 of the cell. Further, each of the auxiliary capacity wire common wires 83 is connected with an auxiliary capacity wire common wire connecting line 85 which is provided for each cell column. Namely, one of the auxiliary capacity wire common wire connecting lines 85, that is disposed so as to run through the left ends of the cells A1, A2, and A3 of column A, is connected with three auxiliary capacity wire common wires 83 of the cells of A column. Furthermore, the auxiliary capacity wire common wire connecting line 85 is extended to the upper and lower circumferential parts of the collective substrate 81. The circumferential parts are respectively adjacent to the upper end of the cell A1 and the lower end of the cell A3. And the auxiliary capacity wire common wire connecting line 85 is connected with terminals (signal inputting section) 85a in the circumferential parts. In the same manner, in the cells B1, B2, and B3 of B column and in the cells C1, C2, and C3 of C column, the auxiliary capacity wire common wires 83, which are connected with the auxiliary capacity wires 4, are bundled by the auxiliary capacity wire common wire connecting line 85 and are connected with the terminals 85a.

Furthermore, for each of the cell columns, signal-line common wires (signal line common wire) 86 and 87 and the switching wire 88 are disposed so as to run through the left ends of the cells. Moreover, the signal-line common wires 86 and 87 and the switching wire 88 are extended to the upper and lower circumferential parts of the collective substrate 81. The circumferential parts are respectively adjacent to the highest cell and the lowest cell of each of the columns. And, the signal-line common wires 86 and 87 and the switching wire 88 are respectively connected with terminals (signal inputting section) 86a, terminals (signal inputting section) 87a, and terminals (signal inputting section) 88a. Here, in FIG. 11, the signal-line common wires 86 and 87, the switching wire 88, and the auxiliary capacity wire common wire connecting line 85 are disposed from the left end of the cell.

As described above, as for the collective substrate 81, a method is adopted, in which the inspection wires of the signal lines input signals via the aforementioned active elements; therefore, the collective substrate 81 is provided with the signal-line common wires 86 for inspecting odd-numbered signal lines, the signal-line common wires 87 for inspecting even-numbered signal lines, and the switching wires 88 for turning on and off the active elements. Further, in each of the cells, the signal-line common wires 86 and 87 and the switching wire 88 are formed in the scanning-line layer so as to be electrically connected with the corresponding wires of another cell.

Here, the following explanation describes the reason for forming the signal-line common wires 86 and 87 and the switching wires 88 in the scanning-line layer.

These wires respectively intersect the signal lines in the ends of the cells. As described above, even after the inspection, the construction of these wires remains the same in the cell; thus, at the intersections, an insulating film provided between the layers needs to have a low density of defects and higher reliability. However, for example, in the case of an insulating film which is made of a material such as SiNx and is made into a film by normally used CVD (chemical vapor deposition), a crack tends to appear at the edge of a step of the lower layer and the insulating film tend to have many defects such as a pinhole. In order to overcome these defects, after the lower layer has been patterned, the substrate is anodized so as to have a double insulating film.

Therefore, it is effective to anodize the scanning-line layer including the signal-line common wires 86 and 87 and the switching wire 88. However, like the conventional construction, the cells surrounded by the short rings are disposed laterally and longitudinally in the layer which requires anodization for each of the cells, and the short rings are simultaneously anodized from the circumferential parts of the substrate. In this method, the signal-line common wires 86 and 87 and the switching wire 88 are short-circuited to the scanning-line common wire 82 in the cell; thus, prior to inspection, it is necessary to perform operations such as a laser cutting in order to electrically release these wires.

In view of this point, by adopting the double conductive layer, the collective substrate 81 makes it possible to properly arrange the wires which intersect one another in a complex manner, so that the wires of one system are favorably disposed in one direction. Hence, without adding steps including a laser cutting, it is possible to perform anodization and to input inspection signals.

Namely, in the collective substrate 81, each of the wires is connected with the longitudinal wires, which are anodized and receive inspection signals. With this arrangement, upon anodization, a conductive bar, etc. comes into contact with the side where the terminals 84a, 85a, 86a, 87a, and 88a so as to apply a positive voltage from the terminals, and then, the substrate is dipped into electrolytic solution. Furthermore, upon performing an electrical inspection, in the same manner as the aforementioned embodiments, an inspection scanning signal is inputted from the terminal 84a, auxiliary capacity voltage is applied from the terminal 85a, inspection signals are inputted from the terminals 86a and 87a, and voltage is applied from the terminal 88a for turning on the active element; therefore, an efficient inspection can be realized.

Moreover, like the aforementioned embodiments, the present embodiment has a variety of advantages on the electrical inspection, including a design of the probe frame. Here, as described in the aforementioned embodiments, the following arrangement is effective: in the upper and lower circumferential parts of the collective substrate 81, the terminals of the same type (inspection signal input pad) are connected with one another in the signal-line layer in a lateral direction of FIG. 11 so as to further reduce the number of places for inputting inspection signals.

As described above, the collective substrate 81 of the active-matrix substrates of the present embodiment is provided with the scanning-line common wires 82 connected with the scanning lines 2, and the scanning-line common wire connecting lines 84 connected with the scanning-line common wires 82; the auxiliary capacity wire common wires 83 connected with the auxiliary capacity wires 4, and the auxiliary capacity wire common wire connecting lines 85 connected with the auxiliary capacity wire common wires 83; and the signal-line common wires 86 and 87 connected with the signal lines in common, and the switching wires 88. All these common wires are formed in one of the scanning-line layer and the signal-line layer that is lower than the other. Moreover, these common wires are not electrically connected with one another in a region having a repeated pattern of the cell.

This arrangement makes it possible to properly arrange the wires, which intersect one another in a complex manner, by adopting the double conductive layer, so that the wires of one system are favorably disposed in one direction. In addition, the insulating film, which is disposed at the intersections of the wires including the inspection short circuit wire, has a double layer structure including an anodized film of the lower layer; therefore, a favorable non-defective rate and reliability can be secured. Further, it is possible to perform an anodizing operation and to input an inspection signal, without adding a step of cutting between the wires of different systems by laser, etc. before the electrical inspection has been performed on the large-format substrate. Moreover, it is possible to protect the scanning lines, the signal lines, and the semiconductor elements from static electricity.

[EMBODIMENT 6]

Figure 12:
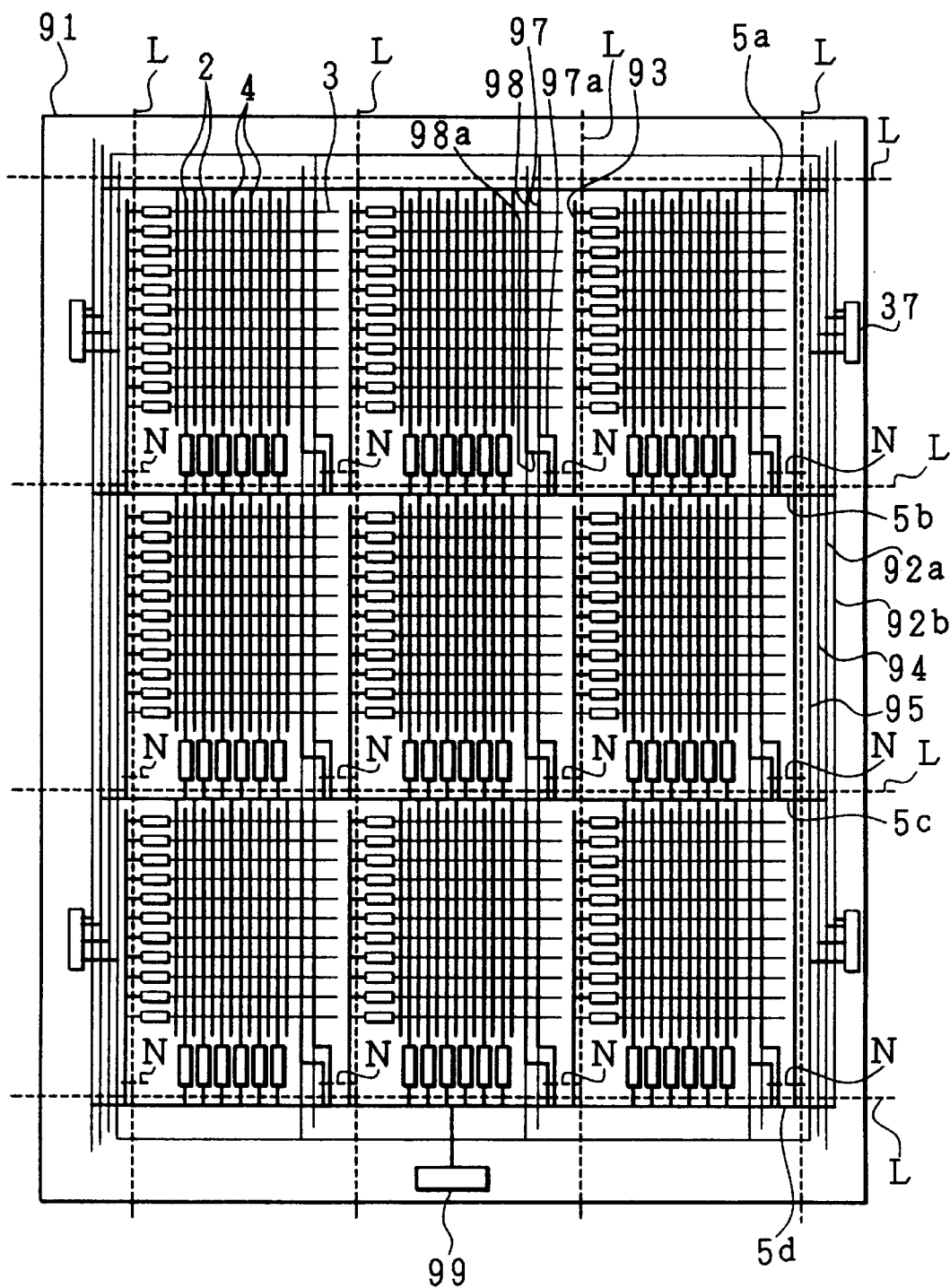
FIG. 12 is a plan model view schematically showing a collective substrate of active-matrix substrates in accordance with still another embodiment of the present invention.
Figure 13:
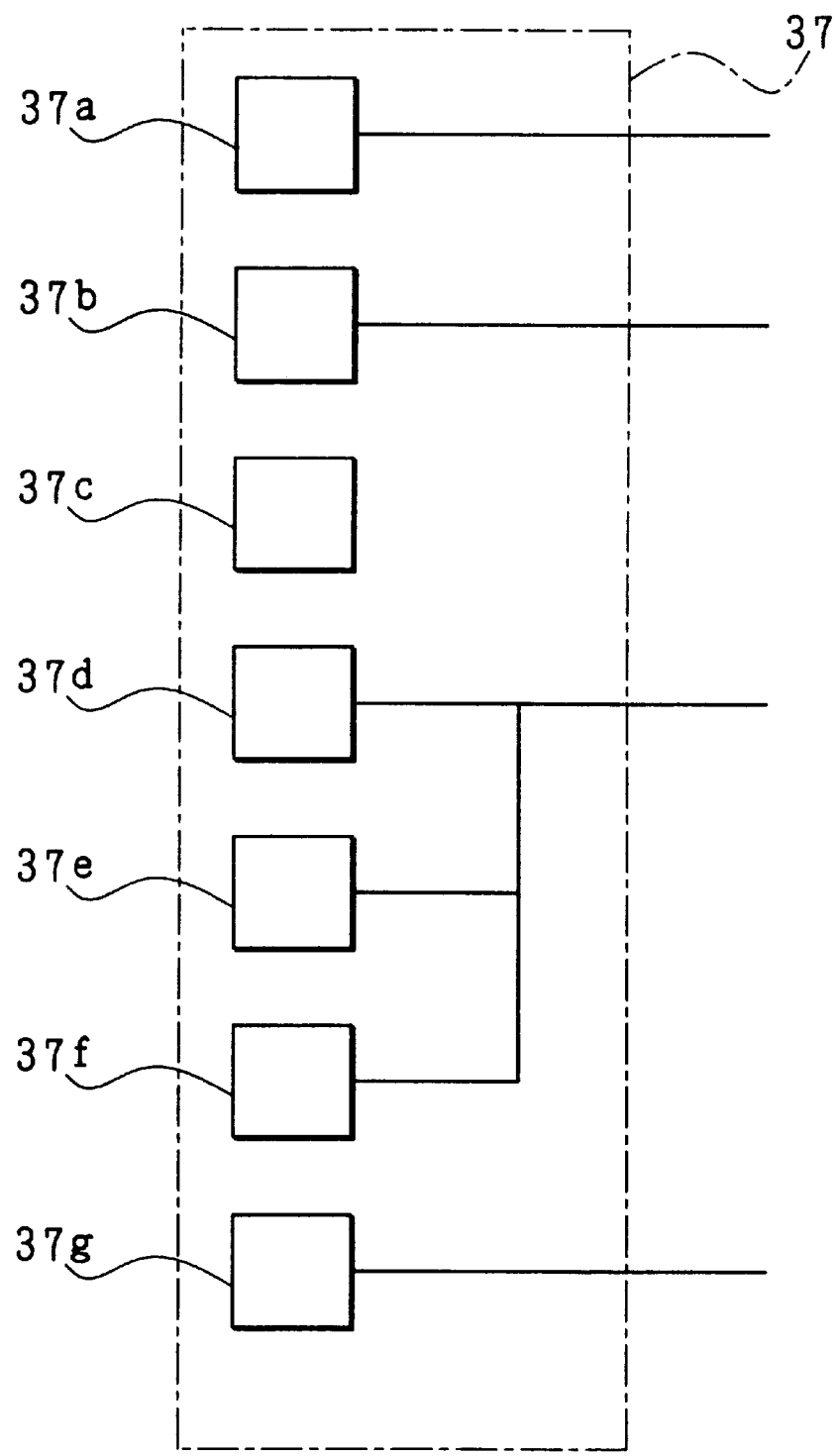
FIG. 13 is a plan model view schematically showing a signal input pad group of the collective substrate of the active-matrix substrates shown in FIG. 12.
Figure 15:
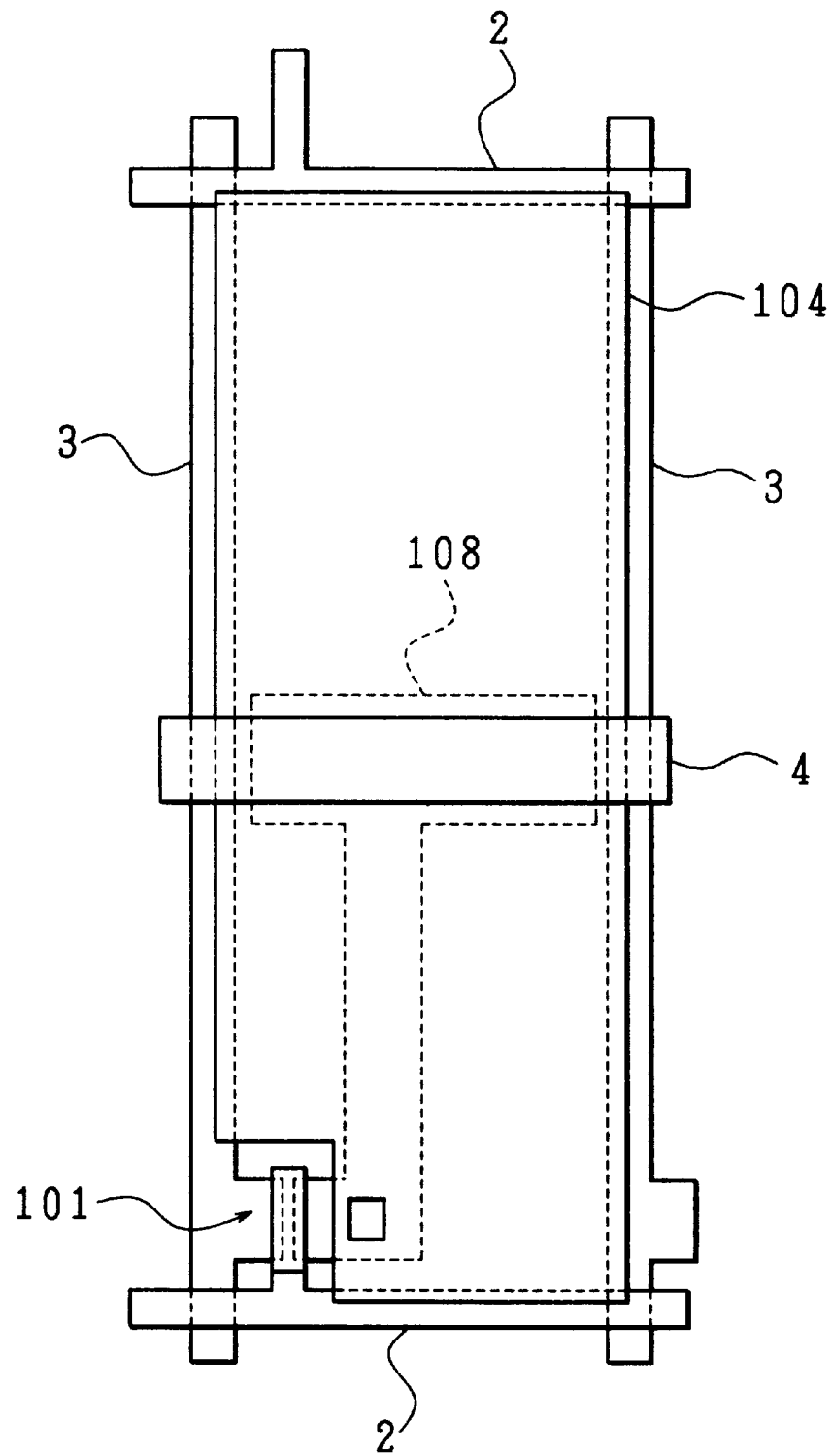
FIG. 15 is a plan model view showing a pixel portion of an active-matrix substrate constituting an active-matrix liquid crystal display device.
Figure 16:
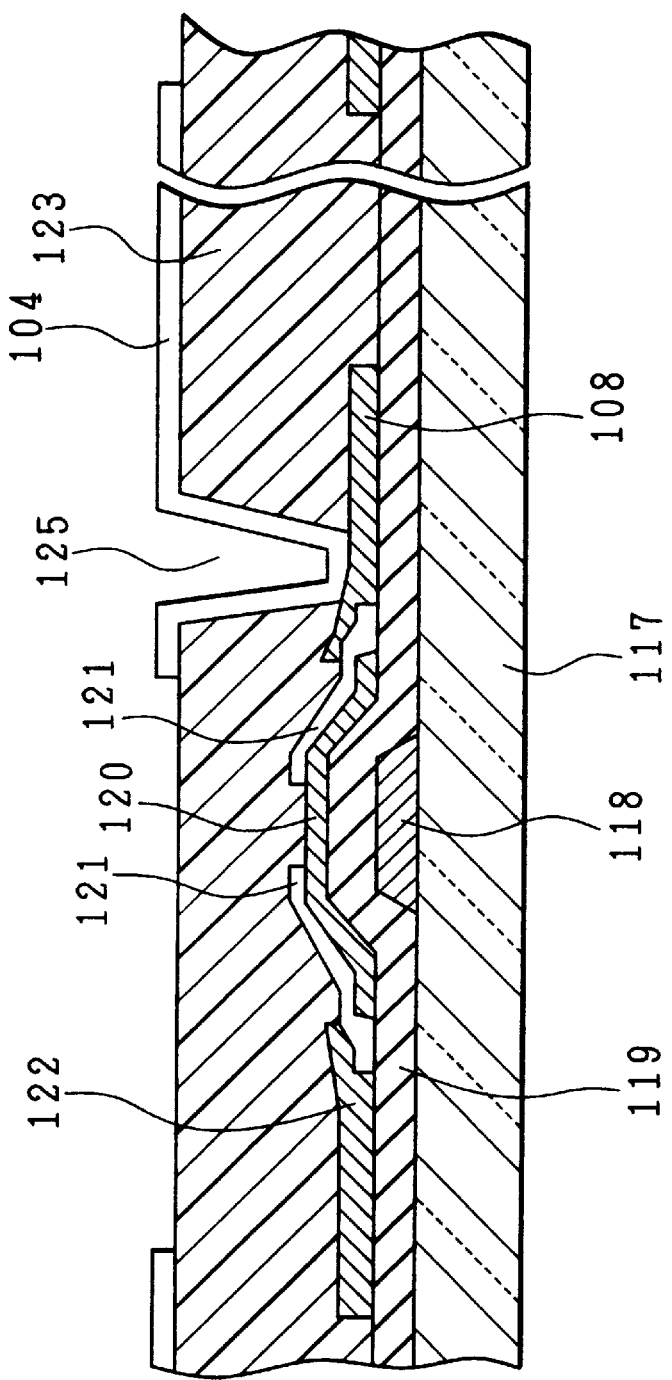
FIG. 16 is a sectional view of a main portion of the active-matrix substrate constituting the active-matrix liquid crystal display device.
Figure 17:
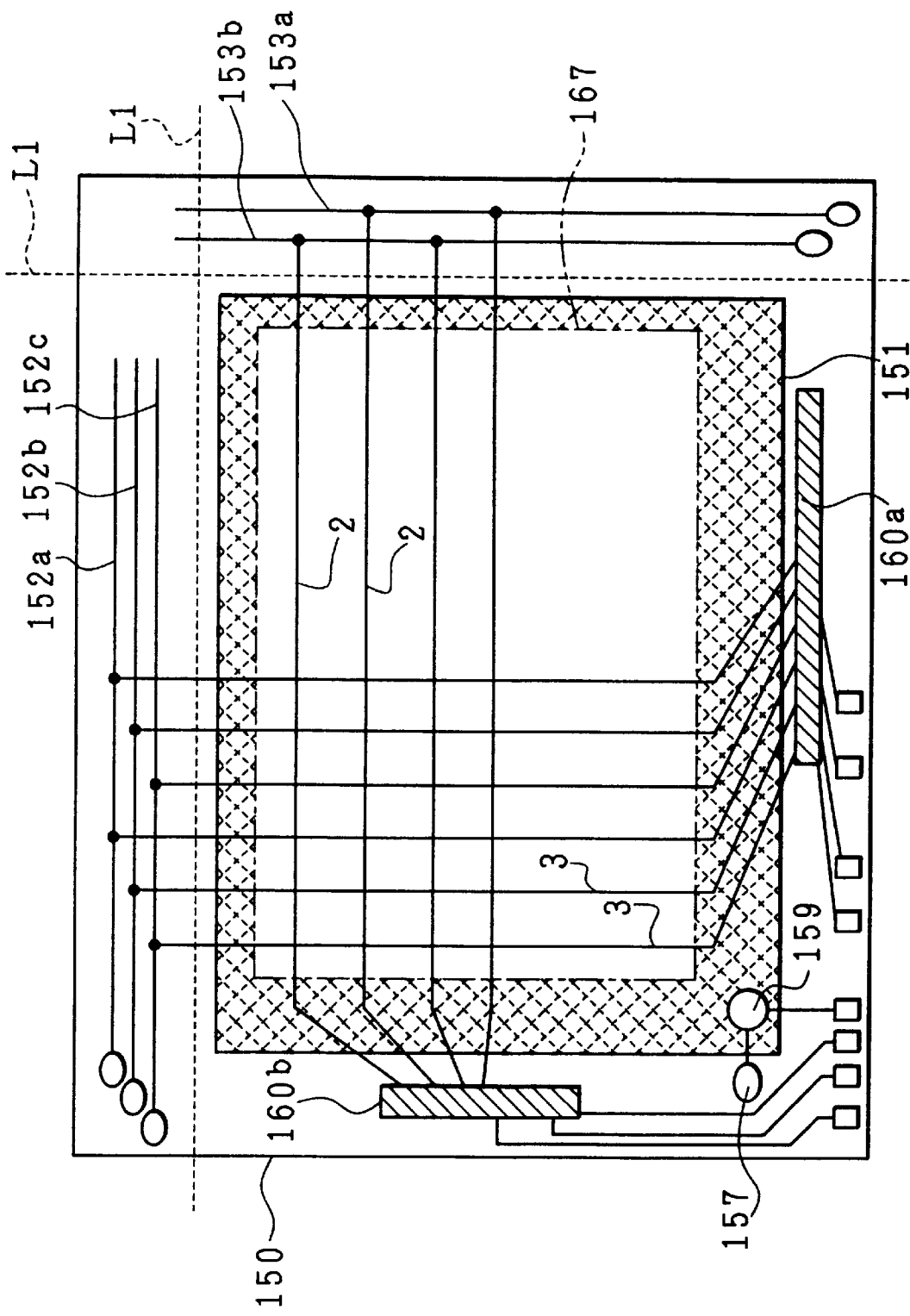
FIG. 17 is a plan model view schematically showing a cell of a conventional active-matrix substrate.

Referring to FIGS. 12, 13, and 14(c), the following explanation describes still another embodiment of the present invention. Here, for convenience of explanation, those members that are described in the conventional art and Embodiments 1 through 5 are indicated by the same reference numerals and the description thereof is omitted.

FIG. 12 is a plan model view schematically showing another collective substrate of active-matrix substrates in accordance with the present embodiment. Here, in FIG. 12, wires formed on the scanning-line layer are shown by thick lines, and wires formed on the signal-line layer are shown by thin lines.

As shown in FIG. 12, a collective substrate 91 of active-matrix substrates of the present embodiment (hereinafter, abbreviated as the collective substrate) has a construction in which each cell is surrounded by short rings. This construction is described in the aforementioned embodiment 5 for comparison.

Specifically, wires of the collective substrate 91 are arranged as follows:

Scanning-line short rings 5a and 5c, and scanning-line short rings 5b and 5d are respectively connected with scanning-line short ring connecting lines 92a and 92b in the circumferential parts of the collective substrate 91. Four signal input pad groups 37 are respectively disposed on the circumferential parts of the collective substrate 91 that are adjacent to cells A1, A3, C1, and C3. The scanning-line short ring connecting lines 92a and 92b are respectively connected with Go pads 37a and Ge pads 37b (FIG. 13) of the signal input pad groups 37.

Further, for anodization, an anodization voltage applying terminal 99 is connected with the scanning-line short ring 5d in the circumferential part of the substrate, that is adjacent to the lower end of the cell B3. Additionally, an anodization voltage supplying line 96 is disposed so as to run through the right ends of the cells of A column and is connected with the scanning-line short rings 5a through 5d. In each of the cells, signal lines 3 are extended to the left over the cell boundary and are connected with a signal-line short ring (signal line common wire) 93, which is disposed along the left end of the cell, via signal line terminals 3a. The signal-line short ring 93 is extended downward and is connected with the scanning-line short rings 5b through 5d, each being disposed in each of the cell rows.

Furthermore, in each of the cell columns, a signal-line inspection wire 97 and a switching wire 98 are disposed along the right ends of the cells. Moreover, the signal-line inspection wire 97 is extended to the circumferential part of the collective substrate 91, that is adjacent to the upper end of the highest cell, and is connected with a signal-line inspection wire connecting line 94 in the circumferential part. The signal-line inspection wire connecting line 94 is further extended to the upper and lower circumferential parts of the collective substrate 91 along the cells and is connected with R pads 37d (FIG. 13) of the four signal input pad groups 37. In the same manner, the switching wire 98 is extended to the circumferential part of the collective substrate 91, that is adjacent to the lower end of the lowest cell, and is connected with a switching-wire connecting line 95 in the circumferential part. The switching-wire connecting line 95 is further extended to the right and left circumferential part of the collective substrate 91 along the cells and is connected with SW pads 37g (FIG. 13) of the four signal input pad groups 37.

Here, the signal-line inspection wires 97 and the switching wires 98 are disposed both in the scanning-line layer and the signal-line layer. Namely, in a matrix part of an effective display area, the signal-line inspection wires 97 and the switching wires 98 are formed in the scanning-line layer; meanwhile, in an area including a cell boundary, the signal line inspection wires 97 and the switching wires 98 are formed in the signal-line layer. In other words, at the upper and lower ends of the cells, the signal-line inspection wires 97 and the switching wires 98 are arranged so as to run the signal-line layer and to cross the cell boundaries. Further, at the lower end of the cell where the wire runs from one layer to the other, the wires of the scanning-line layer branch to the right end of the cell. The branching wires are connected to the scanning-line short rings 5b through 5d as signal-line inspection wire cutting portions 97a and switching-wire cutting portions 98a. Additionally, the signal-line inspection wire cutting portions 97a and the switching-wire cutting portions 98a are cut along cutting lines N by using laser, before an electrical inspection has been performed after anodization. Moreover, in FIG. 12, the signal-line inspection wires 97 and the switching wires 98 are disposed from the right ends of the cells.

With this arrangement, the collective substrate 91 has the following advantages:

Firstly, upon anodization, in the case of defects such as a broken wire, the cells over the broken portion are not subjected to anodization. In addition to the case of a broken wire, for example, when the signal input pad has poor contact, the same inconvenience is caused.

In view of this point, the collective substrate 91 is provided with the short rings in each of the cells, and these short rings are shared by the adjacent cells; thus, even in the event of a broken wire, voltage can detour the surrounding cells so as to be applied to the short rings; consequently, any problems are not caused upon anodization.

In the collective substrate 91, voltage applied to the anodization voltage applying terminal 99 is transmitted to the scanning-line short ring 5d and applied to the upper cells via the anodization voltage supplying line 96. From the anodization voltage supplying line 96, the voltage is applied to the scanning-line short rings 5a through 5c so as to anodize the respective cells.

Here, FIG. 12 shows the simplest construction of the collective substrate 91 in order to simplify the flow of a signal of an electrical inspection. Therefore, this method cannot sufficiently overcome the aforementioned problem of a broken wire.

For this reason, in order to solve the problem, it is effective to provide a wire for connecting the scanning-line short rings 5a, 5b, 5c, and 5d for each of the cell columns. In this case, the additionally disposed wire needs to be cut by laser before an electrical inspection, so that portions to be cut increase as compared with the construction of FIG. 12. However, upon anodization, the short rings are longitudinally and laterally connected in a matrix form so as to solve the aforementioned problem of a broken wire. In addition, in the left circumferential part of the collective substrate 91, another wire is allowed to be disposed for short-circuiting the scanning-line short rings 5a through 5d. These wires effectively overcome the problem of a broken wire upon anodization; however, upon an electrical inspection, the wires need to be cut for each of the signal systems, for example, for the scanning-line short rings 5a and 5c, and for the scanning-line short rings 5b and 5d. Thus, these wires are disposed around the cutting lines N so as to be cut at the time when the substrate is cut by laser along the cutting lines N prior to the inspection. Secondary, before the cutting operation is carried out prior to an electrical inspection, the active element or the insulating film is not damaged even when the substrate is subjected to static electricity. Namely, as for the collective substrate 91, before the laser cutting, the short rings are not short-circuited for each of the signal systems. Instead, all the wires are short-circuited by the short rings. Thus, even when the potential varies entirely on the collective substrate, excessive voltage is not applied between the wires, for example, between the scanning line and the signal line, and between the signal line and the auxiliary capacity wire.

Incidentally, when an electrical inspection is carried out on the collective substrate 91 which has the aforementioned manner, prior to the inspection, continuity is removed between the different signal systems along the cutting lines N.

As shown in FIG. 12, the signal-line inspection wires 97 and the switching wires 98 branch to the signal-line layer just before crossing the cell boundary. Upon crossing the scanning-line short rings 5b through 5d which are shared by the respective signal systems and are located between the cells, the signal-line inspection wire 97 and the switching wire 98 are located away from the signal-line inspection wire cutting portions 97a and the switching wire cutting portions 98a of the scanning-line layer.

Hence, the signal line inspection wire cutting portions 97a and the switching wire cutting portions 98a are cut by laser along the cutting lines N so as to remove the continuity for anodization in the scanning-line layer; thus, the different type wires are insulated from one another. However, in each of the cell columns, the signal-line inspection wire 97 and the switching wire 98 maintain the continuity via the short-circuit line of the signal-line layer. Therefore, upon an electrical inspection, inspection signals are inputted from the signal input pad groups 37 and the inspection signals are applied to all the cells so as to complete the inspection.

Further, in the circumferential parts of the collective substrate 91, the signal input pad groups 37 are disposed at positions in common among models, so that the same probe frame can be adopted for any model. The cost-effectiveness on manufacturing the probe frame has been described in the aforementioned embodiments.

Incidentally, upon cutting along the cutting lines N, in addition to the signal-line inspection wire cutting portions 97*a* and the switching wire cutting portions 98*a*, it is needless to say that the signal-line short rings 93 also need to be electrically released in order to carry out an electrical inspection. In each of the cells, these three wires are arranged at cutting portions so as to be cut at one time by using laser irradiation having a proper slit width, in a considerably effective manner. Namely, as for an n- by m-cell collective substrate, (n+1)×m laser irradiating operations complete the cutting operation. In the collective substrate 91, as for nine cells, merely twelve irradiating operations are required in total. Therefore, it is possible to minimize an increase in workload (tact) of the laser cutting; thus, this arrangement is quite favorable for mass production.

Further, in the collective substrate 91, an inspection display signal p3 (FIG. 14(*c*)) is not inputted for each of RGB. Instead, a single signal is inputted to all the signal lines 3; thus, the signal lines 3 are connected with one signal-line short ring 93. However, when the inspection display signal is inputted for each of RGB, or for each of the odd-numbered and the even-numbered lines, the signal-line short ring is provided for each of the signal systems, or the signal lines 3 are not short-circuited with one another. Further, instead of a method for performing an electrical inspection via the active elements, when the inspection display signals are inputted from the signal-line short rings 93, the inspection display signals are inputted to the signal-line short rings 93 while the cell boundary has the same construction as the signal line inspection wire 97, and the branched wires are cut by laser; consequently, the same effect can be achieved. Here, such variations are not to be regarded as a departure from the objective and effect of the present invention.

As described above, as for the collective substrate 91 of the active-matrix substrates of the present embodiment, among the layers, each including one of the scanning lines and the signal lines, the lower scanning-line layer has the signal-line short rings 93, the signal-line inspection wires 97, the switching wires 98, and the scanning-line short rings 5*b* through 5*d* connecting these wires; and the signal-line inspection wires 97 of the adjacent cells are electrically connected with each other and the switching wires 98 of the adjacent cells are electrically connected with each other, via the signal-line layer (conductive thin film).

With this arrangement, all the wires which are subjected to anodization are formed in the scanning-line layer, and after anodization, it is possible to remove the continuity between the different type wires. Further, an electrical inspection can be performed in a state in which the wires of the same type are electrically connected with each other between the adjacent cells in the signal-line layer.

Therefore, it is possible to protect the signal lines, the scanning lines, and the semiconductor elements from static electricity. In addition, the insulating film, which is disposed at the intersections of the wires including the inspection short circuit wire, has a double layer structure including an anodized film of the lower layer; therefore, a favorable non-defective rate and reliability can be secured. Furthermore, before the electrical inspection has been performed on the large-format substrate, even when a cutting operation is performed by using laser, etc. between the different type wires which are electrically connected with each other in the lower layer, these wires are electrically connected with the corresponding type short circuit wires of the adjacent cell in the upper layer, so that an electrical inspection can be carried out.

Here, the scope of the present invention is not limited to the aforementioned embodiments. Variations are acceptable within the scope of the present invention.

As described above, the collective substrate of the active-matrix substrates of the present invention is also allowed to have a construction in which: the active-matrix substrates of the collective substrate are divided into a plurality of blocks; and the scanning-line common lines are electrically connected with each other and the signal-line common lines are electrically connected with each other on the active-matrix substrates in each of the blocks.

With the above-mentioned arrangement, even when a heavy load is required to simultaneously drive the entire substrate and a signal delay occurs due to an output impedance of a driving circuit, some of the divided blocks can be driven; consequently, it is possible to design the driving circuit in a simple manner and to prevent an increase in the cost.

Further, the active-matrix substrates are divided into blocks so as to reduce the load capacity; therefore, even in the case of an insufficient width of the inspection wire, it is possible to readily supply inspection signals without delay.

Furthermore, the collective substrate of the active-matrix substrates of the present invention is also allowed to have a construction in which respectively, the scanning-line common wires and the signal-line common wires of one block are electrically connected with the scanning-line common wires and the signal-line common wires of another block of the collective substrate.

This arrangement makes it possible to input signals to a plurality of blocks and a plurality of cells. Therefore, even when the cells have different constructions or when the model is changed, it is possible to carry out an inspection by using the same probe frame; consequently, the active-matrix substrate can be manufactured with higher efficiency at low cost.

Moreover, the collective substrate of the active-matrix substrates of the present invention is also allowed to have a construction in which a plurality of signal inputting sections are provided so as to virtually equalize the loads of the inspection scanning signal and the inspection display signal in the connected wires.

With this arrangement, a plurality of signal input pads are provided for one signal system; thus, even when some signal input pads have poor contact, inspection signals from the other signal input pads can compensate for the defected signal input pads so as to carry out the inspection without causing any problems.

Further, when the load applied to the wires is too large, a signal delay occurs in accordance with the resistance value of the wires; however, a plurality of signal input pads are provided so as to overcome this problem. And then, a plurality of signal input pads are disposed so as to equalize the loads of the allocated wires; therefore, the effect is enhanced.

Additionally, the collective substrate of the active-matrix substrates of the present invention is also allowed to have a construction in which the signal inputting sections are disposed at positions in common among a plurality of kinds of collective substrates of the active-matrix substrates.

With this arrangement, the signal inputting sections for an electrical inspection are disposed at portions in which any display pattern are not formed, in common among models; thus, any model can be inspected by inputting signals merely to the signal inputting sections. Consequently, a single probe frame can inspect a plurality of models. Therefore, it is not necessary to design a probe frame for each of the models so as to manufacture the active-matrix substrate at low cost.

Moreover, the collective substrate of the active-matrix substrate of the present invention is also allowed to have a construction in which the scanning-line common wires and the signal-line common wires are formed in one of the scanning-line layer and the signal-line layer, that is lower than the other layer.

With this arrangement, the insulating film, which is disposed at the intersections of the wires including the inspection short circuit wire, has a double layer structure including an anodized film of the lower layer; therefore, a favorable non-defective rate and reliability can be secured. Further, it is possible to perform an anodizing operation and to input inspection signals, without adding a step of performing a cutting operation between the wires of different systems by laser, etc. before the electrical inspection has been performed on the large-format substrate. Moreover, it is possible to protect the scanning lines, the signal lines, and the semiconductor elements from static electricity.

Additionally, the collective substrate of the active-matrix substrates is also allowed to have a construction in which the scanning-line common wires are electrically connected with each other and the signal-line common wires are electrically connected with each other via the conductive thin film, not via the layer where the common wires are formed.

This arrangement offers the following advantages: firstly, it is possible to protect the signal lines, the scanning lines, and the semiconductor elements from static electricity; secondly, the insulating film, which is disposed at the intersections of the wires including the inspection short circuit wire, has a double layer structure including an anodized film of the lower layer; therefore, a favorable non-defective rate and reliability can be secured; and thirdly, before an electrical inspection has been performed on a large-format substrate, even if the different type wires, which are electrically connected with each other in the lower layer, are cut by using laser, etc., the wires are electrically connected with the corresponding type short circuit wires of the adjacent cell in the upper layer, so that it is possible to carry out the electrical inspection.

Further, the collective substrate of the active-matrix substrates of the present invention is also allowed to have a construction in which the active-matrix substrate is arranged so as to have the scanning-line common wires and the signal-line common wires upon cutting out the active-matrix substrate from the collective substrate.

With this arrangement, after completion of the panel, upon performing a lighting inspection for each of the divided active-matrix substrates, the scanning lines and the signal lines are electrically connected with the scanning-line common wire and the signal-line common wire respectively in each of the active-matrix substrates; thus, it is possible to input inspection signals at one time. Namely, even when the active-matrix substrates are cut out so as to cut the wires connecting the active-matrix substrates, no inconvenience is imposed in the lighting inspection performed on each of the active-matrix substrates. Furthermore, even after the active-matrix substrates have been cut out, the scanning-line common wires and the signal-line common wires remain; therefore, it is possible to protect the active-matrix substrates from static electricity.

Finally, instead of inputting signals respectively to the cells of the collective substrate of the active-matrix substrates, signals are inputted to the specific portions of the collective substrate so as to simultaneously input signals to a plurality of cells. The significance of this arrangement has been conventionally recognized. Therefore, some conventional arts have a few common arrangements with the present invention.

Japanese Published Unexamined Patent Application no. 222925/1990 (Tokukaihei 2-222925, published on Sep. 5, 1990) discloses a conventional art for a lighting inspection using a simple matrix method, in which the ends of wires or the ends of terminals are electrically short-circuited by short circuit lines in a plurality of cells, and voltage is applied to the input pads of the short circuit lines, so that a lighting inspection can be simultaneously performed on a plurality of cells. However, in the simple matrix method, a single substrate has a single kind of signal: in a row direction or a column direction; therefore, it is possible to achieve the objective merely by electrically connecting all these members in a simple manner.

Meanwhile, the present invention relates to the active-matrix method. Further, in view of the fact that: at least the signal inputting sections are provided for inputting signals to the scanning lines, the signal lines, and the opposing common electrodes; and the auxiliary capacity wires and spare wires for correcting defects are provided in some cases, the present invention is quite different. In addition, in order to achieve the aforementioned objective, this invention is devised for reducing the signal inputting portions in an efficient manner on the substrate which requires a plurality of input signal types, and for improving the construction of signal inputting section that tends to reduce efficiency upon inspection. Therefore, the objective of the present invention is remarkably different from that of the conventional arts, which are simply aimed at applying voltage and a signal.

Further, in the conventional active-matrix substrate, in order to enhance the insulating property and to improve reliability, it is necessary to anodize one of the signal-line layer and the scanning-line layer that is lower than the other layer, and to prevent static damage; thus, generally, all the wires are previously brought into conduction by short circuit wires, which are called short rings. However, in order to input signals of a plurality of types, it is necessary to consider that the wires are brought into conduction by the different short rings for each of the signal systems, or the short rings are cut off for each of the signal systems in one step.

As described above, the collective substrate of the active-matrix substrates of the present invention is based on the concept which is different from those of the conventional active matrix and simple matrix constructions. Namely, the present invention offers an absolutely new construction which is devised for performing an electrical inspection on a large-format active-matrix substrate with high efficiency and accuracy, and for manufacturing an inspection probe frame in a simple manner at low cost.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A collective substrate of active-matrix substrates, a plurality of said active-matrix substrates, each comprising:
   on an insulating substrate,
   a plurality of pixel electrodes;
   pixel switching elements, each being connected with each of said pixel electrodes;
   a plurality of scanning lines and signal lines which drive said pixel electrode via said pixel switching element and are disposed in a lattice form;
   a scanning-line common wire which is connected with said scanning lines; and
   a signal-line common wire which is connected with said signal lines,
   wherein said scanning-line common wires are electrically connected with each other and said signal-line common wires are electrically connected with each other so as to form said collective substrate.

2. The collective substrate of the active-matrix substrates as defined in claim 1, wherein: said active-matrix substrates of said collective substrate are divided into a plurality of blocks; and as for the active-matrix substrates in each of the blocks, said scanning-line common wires are electrically connected with each other and said signal-line common wires are electrically connected with each other.

3. The collective substrate of the active-matrix substrates as defined in claim 2, wherein said scanning-line common wire and said signal-line common wire of said block are electrically connected respectively with said scanning-line common wire and said signal-line common wire of another block of said collective substrate.

4. The collective substrate of the active-matrix substrates as defined in claim 1, wherein a signal inputting section is disposed for inputting an inspection scanning signal and an inspection display signal respectively to said scanning-line common wire and said signal-line common wire, in a circumferential part of said collective substrate.

5. The collective substrate of the active-matrix substrates as defined in claim 4, wherein a plurality of said signal inputting sections are disposed so as to virtually equalize loads caused by said inspection scanning signal and said inspection display signal, in each of the connected wires.

6. The collective substrate of the active-matrix substrates as defined in claim 5, wherein a plurality of said signal inputting sections are disposed at positions in common among a plurality of kinds of collective substrates of the active-matrix substrates.

7. The collective substrate of the active-matrix substrates as defined in claim 6, wherein a marker is disposed in a circumference part of said collective substrate for identifying a substrate and adjusting a position of the collective substrate.

8. The collective substrate of the active-matrix substrates as defined in claim 7, wherein said signal inputting section is disposed relative to said marker.

9. The collective substrate of the active-matrix substrates as defined in claim 1, wherein said scanning-line common wire and said signal-line common wire are formed in one of a scanning-line layer and a signal-line layer, that is lower than the other layer.

10. The collective substrate of the active-matrix substrates as defined in claim 9, wherein said scanning-line common wire and said signal-line common wire are anodized.

11. The collective substrate of the active-matrix substrates as defined in claim 9, wherein said scanning-line common wires are electrically connected with each other and said signal-line common wires are electrically connected with each other in a layer, which is different from a layer in which said scanning-line and signal-line common wires are formed.

12. The collective substrate of the active-matrix substrates as defined in claim 10, wherein said scanning-line common wires are electrically connected with each other and said signal-line common wires are electrically connected with each other in one of said scanning-line layer and said signal-line layer, that is upper than the other layer.

13. The collective substrate of the active-matrix substrates as defined in claim 1, wherein each of said active-matrix substrates is disposed so as to include said scanning-line common wire and said signal-line common wire when being cut out from said collective substrate.

* * * * *